US008664668B2

(12) United States Patent
Ogihara et al.

(10) Patent No.: US 8,664,668 B2
(45) Date of Patent: Mar. 4, 2014

(54) COMBINED SEMICONDUCTOR APPARATUS WITH SEMICONDUCTOR THIN FILM

(75) Inventors: Mitsuhiko Ogihara, Tokyo (JP); Hiroyuki Fujiwara, Tokyo (JP); Masaaki Sakuta, Tokyo (JP); Ichimatsu Abiko, Tokyo (JP)

(73) Assignee: Oki Data Corporation, Tokyo (JP)

( * ) Notice: Subject to any disclaimer, the term of this patent is extended or adjusted under 35 U.S.C. 154(b) by 374 days.

(21) Appl. No.: 12/654,486

(22) Filed: Dec. 22, 2009

(65) Prior Publication Data

US 2010/0096748 A1     Apr. 22, 2010

Related U.S. Application Data

(62) Division of application No. 10/743,104, filed on Dec. 23, 2003, now abandoned.

(30) Foreign Application Priority Data

Dec. 24, 2002 (JP) .................................. 2002-371724

(51) Int. Cl.
 *H01L 27/15* (2006.01)
(52) U.S. Cl.
 USPC ......................... 257/88; 257/99; 257/E27.121
(58) Field of Classification Search
 USPC ....................................... 257/88, 99, E27.121
 See application file for complete search history.

(56) References Cited

U.S. PATENT DOCUMENTS

| 4,342,102 A | 7/1982 | Puar |
| 5,492,851 A | 2/1996 | Ryou |
| 5,780,321 A | 7/1998 | Shieh et al. |
| 6,184,556 B1 | 2/2001 | Yamazaki et al. |
| 6,194,960 B1 | 2/2001 | Nagumo |
| 6,242,324 B1 | 6/2001 | Kub et al. |
| 6,255,705 B1 | 7/2001 | Zhang et al. |
| 6,351,327 B1 | 2/2002 | Walsh |
| 6,433,367 B1 | 8/2002 | Tohyama et al. |
| 6,739,931 B2 | 5/2004 | Yamazaki et al. |
| 6,841,813 B2 | 1/2005 | Walker et al. |
| 7,288,420 B1 * | 10/2007 | Yamazaki et al. .............. 438/29 |
| 2001/0019133 A1 | 9/2001 | Konuma et al. |
| 2002/0081943 A1 | 6/2002 | Hendron et al. |

(Continued)

FOREIGN PATENT DOCUMENTS

| EP | 0308749 A2 | 3/1989 |
| JP | 61102767 A | 5/1986 |

(Continued)

OTHER PUBLICATIONS

"The Columbia Encyclopedia," Columbia University Press 2004, considered pages on "compound".

(Continued)

*Primary Examiner* — Yu Chen
(74) *Attorney, Agent, or Firm* — Rabin & Berdo, P.C.

(57) ABSTRACT

A combined semiconductor apparatus includes a semiconductor substrate having an integrated circuit, a planarized region formed in a surface of the semiconductor substrate, and a semiconductor thin film including at least one semiconductor device and bonded on the planarized region. A surface of the semiconductor thin film, in which the semiconductor device is formed, is disposed on a side of the planarized region. The apparatus may further include a planarized film disposed between the planarized region and the semiconductor thin film.

1 Claim, 25 Drawing Sheets

(56) References Cited

U.S. PATENT DOCUMENTS

| | | |
|---|---|---|
| 2002/0155795 A1 | 10/2002 | Ferra et al. |
| 2002/0187650 A1 | 12/2002 | Blalock et al. |
| 2003/0067043 A1 | 4/2003 | Zhang |
| 2003/0080338 A1 * | 5/2003 | Yamazaki et al. .............. 257/59 |

FOREIGN PATENT DOCUMENTS

| | | |
|---|---|---|
| JP | 62-123787 A | 6/1987 |
| JP | 63-249669 A | 10/1988 |
| JP | 05008444 A | 1/1993 |
| JP | 09045930 A | 2/1997 |
| JP | 10-063807 A | 3/1998 |
| JP | 11307878 A | 11/1999 |
| JP | 2000-235127 A | 8/2000 |
| JP | 2001167874 A | 6/2001 |
| JP | 2002141492 A | 5/2002 |
| WO | WO-94/11929 A2 | 5/1994 |

OTHER PUBLICATIONS

Merriam-Webster's Collegiate Dictionary, 10th Edition (1999), p. 14, p. 14 only.

Fukuda, M., "Optical Semiconductor Devices," Wiley Series in Microwave and Optical Engineering, Kai Chang Editor, John Wiley& Sons, New York, 1999. ISBN: 0-471-14959-4, p. 211 only.

* cited by examiner

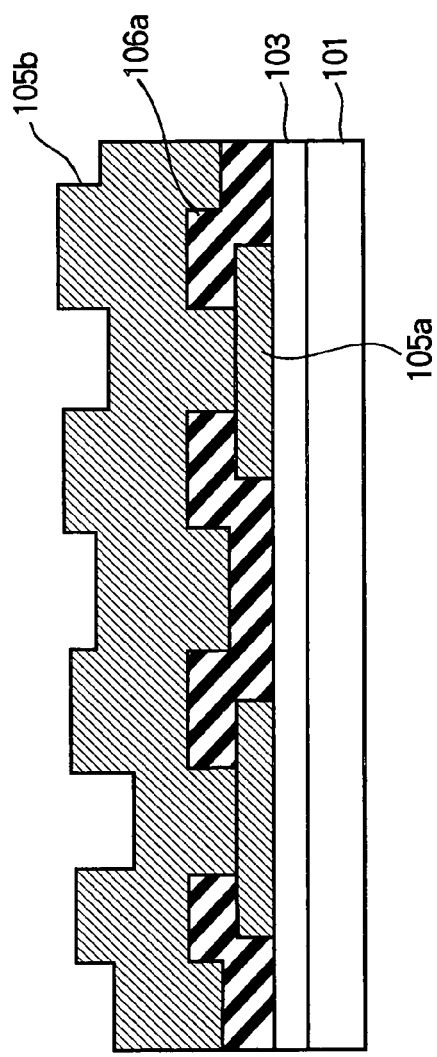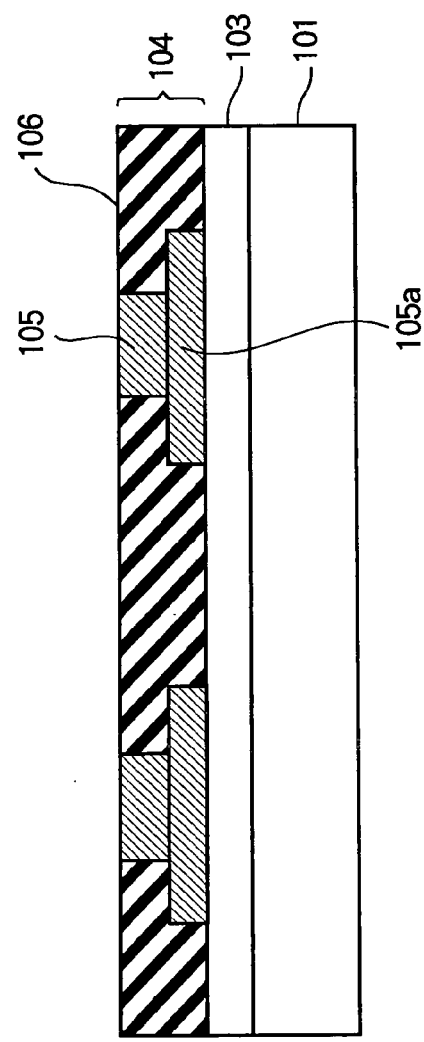

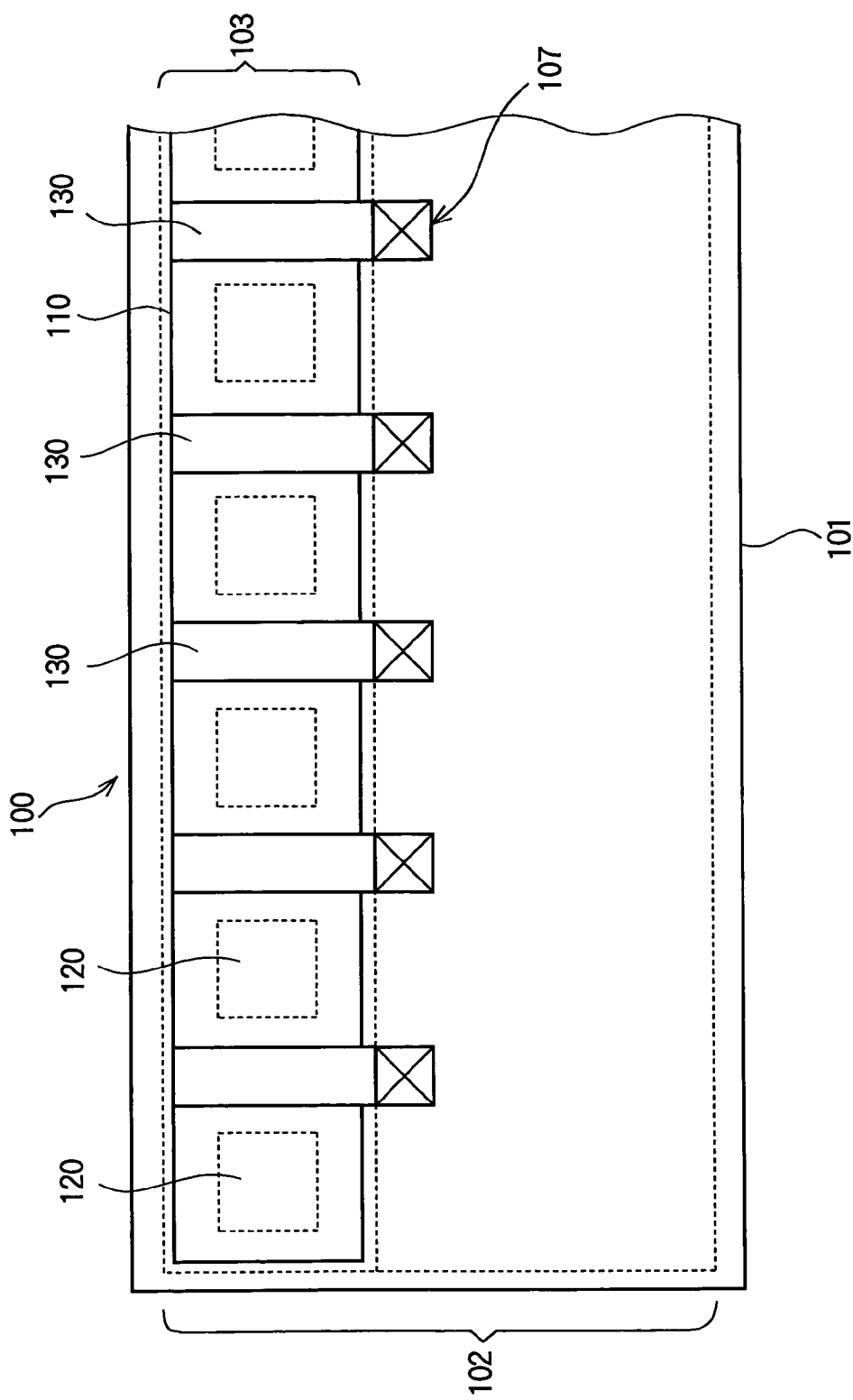

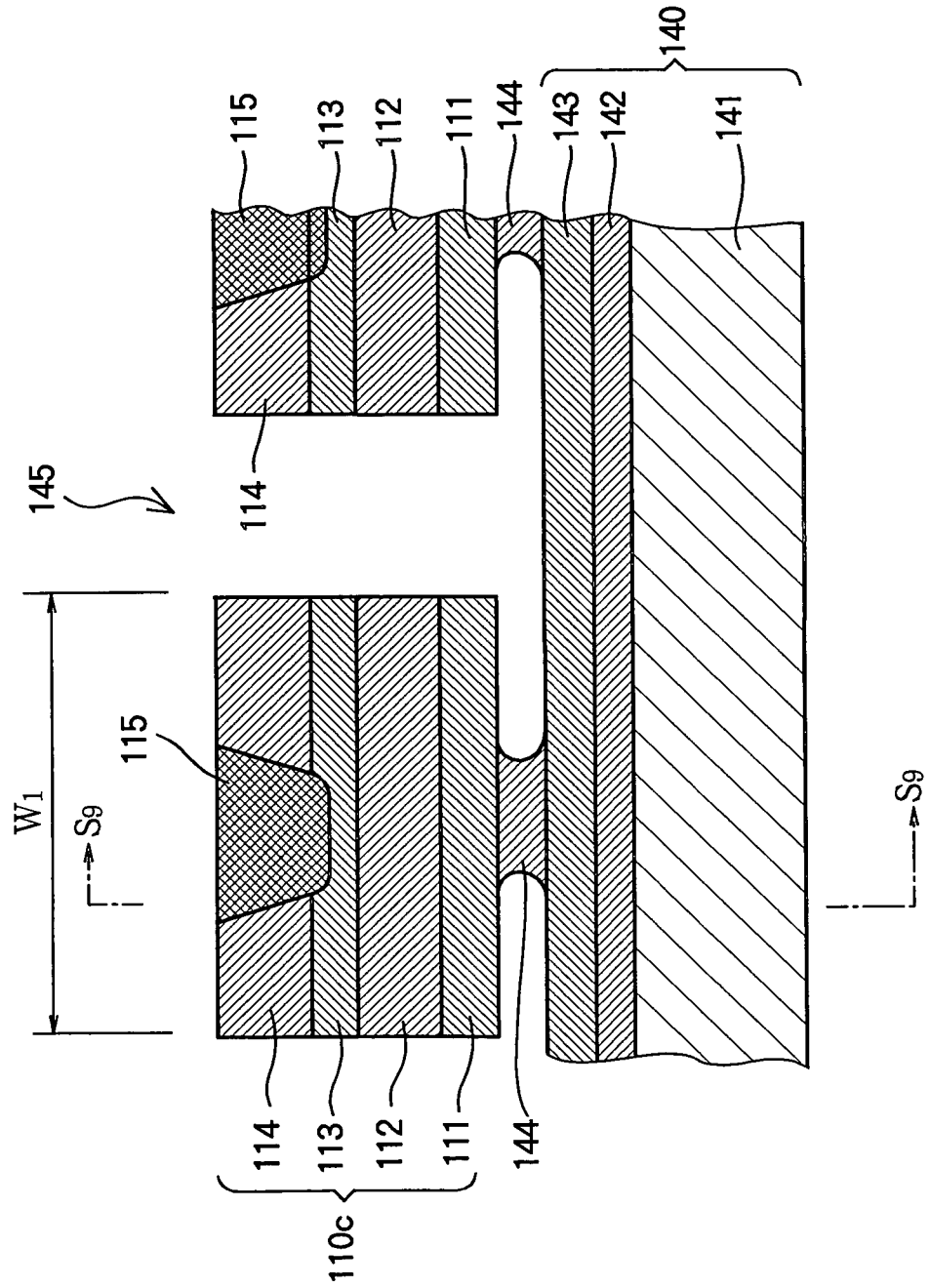

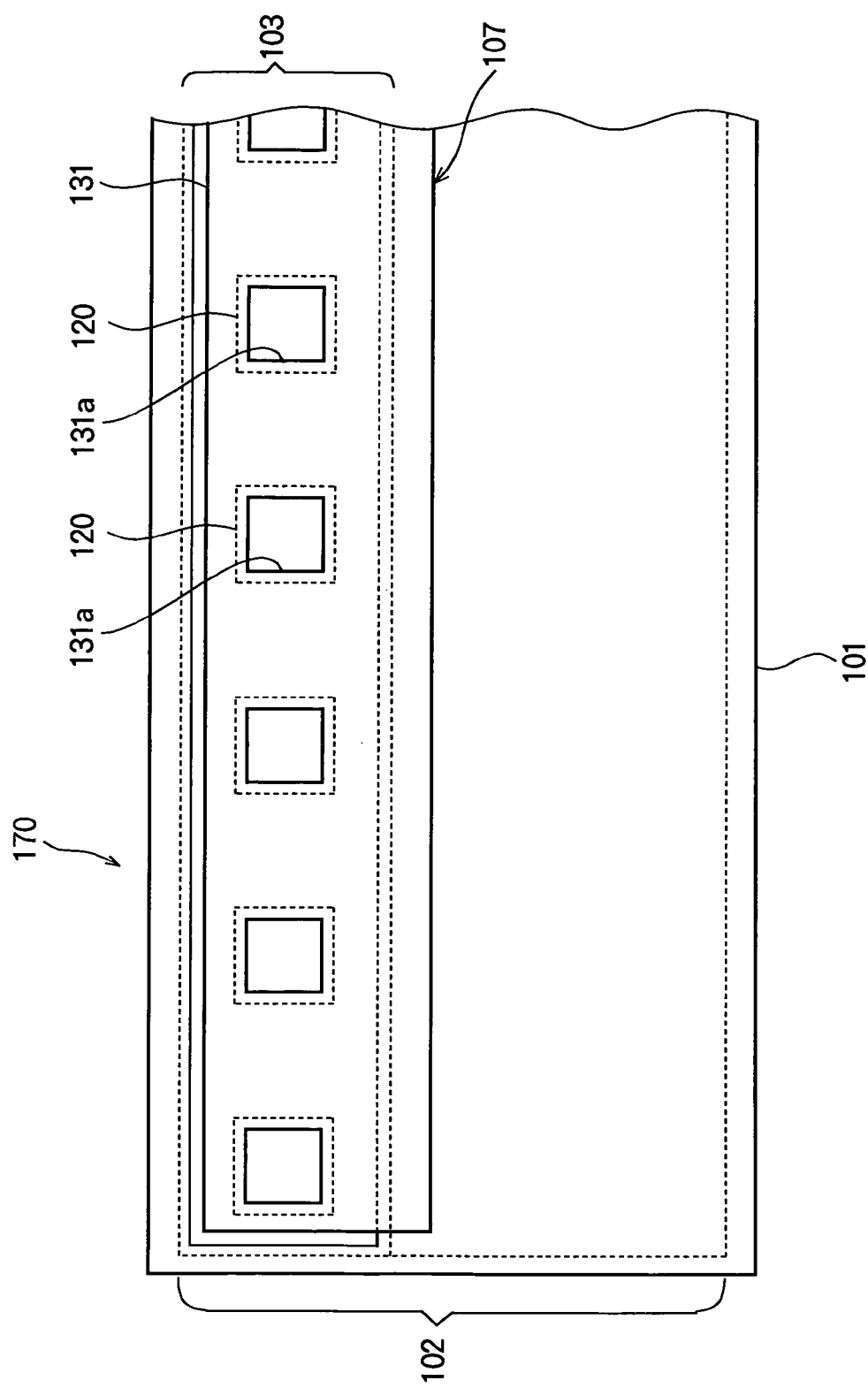

COMBINED SEMICONDUCTOR APPARATUS WITH SEMICONDUCTOR THIN FILM

This application is a divisional of U.S. application Ser. No. 10/743,104, filed Dec. 23, 2003.

BACKGROUND OF THE INVENTION

1. Field of the Invention

The present invention relates to a combined semiconductor apparatus useful in, for example, a light-emitting diode (LED) print head in an electrophotographic printer.

2. Description of the Related Art

FIG. 26 is a perspective view schematically showing a part of a conventional LED print unit, and FIG. 27 is a plan view showing a part of an LED array chip provided to the LED print unit of FIG. 26. Referring to FIG. 26, a conventional LED print unit 900 includes a circuit board 901 on which are mounted a plurality of LED array chips 902 having electrode pads 903, and a plurality of driving integrated circuit (IC) chips 904 having electrode pads 905. The electrode pads 903 and 905 are interconnected by bonding wires 906 through which current is supplied from the driving-IC chips 904 to LEDs 907 formed in the LED array chips 902. Further electrode pads 909 on the driving-IC chips 904 are connected to bonding pads 910 on the circuit board 901 by further bonding wires 911.

For reliable wire bonding, the electrode pads 903, 905, and 909 must be comparatively large, e.g., one hundred micrometers square (100 µm×100 µm), and the LED array chips 902 must have approximately the same thickness as the driving-IC chips 904 (typically 250-300 µm), even though the functional parts of the LED array chips 902 (the LEDs 907) have a depth of only about 5 µm from the surface. To accommodate the needs of wire bonding, an LED array chip 902 must therefore be much larger and thicker than necessary simply to accommodate the LEDs 907. These requirements drive up the size and material cost of the LED array chips 902.

As shown in plan view in FIG. 27, the electrode pads 903 may need to be arranged in a staggered formation on each LED array chip 902. This arrangement further increases the chip area and, by increasing the length of the path from some of the LEDs 907 to their electrode pads 903, increases the associated voltage drop.

The size of the driving-IC chips 904 also has to be increased to accommodate the large number of bonding pads 905 by which they are interconnected to the LED array chips 902.

Light-emitting elements having a thin-film structure are disclosed in Japanese Patent Laid-Open Publication No. 10-063807 (FIGS. 3-6, FIG. 8, and paragraph 0021), but these light-emitting elements have electrode pads for solder bumps through which current is supplied. An array of such light-emitting elements would occupy substantially the same area as a conventional LED array chip 902.

SUMMARY OF THE INVENTION

It is an object of the present invention to provide a combined semiconductor apparatus with a semiconductor thin film that can reduce its size and material cost.

According to the present invention, a combined semiconductor apparatus includes a semiconductor substrate having an integrated circuit, a planarized region formed in a surface of the semiconductor substrate, and a semiconductor thin film including at least one semiconductor device and bonded on the planarized region. A surface of the semiconductor thin film, in which the semiconductor device is formed, may be disposed on a side of the planarized region. The apparatus may further include a planarized film disposed between the planarized region and the semiconductor thin film.

BRIEF DESCRIPTION OF THE DRAWINGS

In the attached drawings:

FIGS. 5A and 5B are schematic cross sectional views for explaining a process of forming a planarized film in the integrated LED/driving-IC chip of the first embodiment;

FIG. 6 is a plan view schematically showing a part of the integrated LED/driving-IC chip of the first embodiment after forming common interconnecting layers;

FIG. 10 is a schematic cross sectional view showing a cross section through line $S_{10}$-$S_{10}$ in FIG. 9;

FIG. 12 is a schematic plan view showing a part of the integrated LED/driving-IC chip in accordance with a modification of the first embodiment;

DETAILED DESCRIPTION OF THE INVENTION

Figure 1:
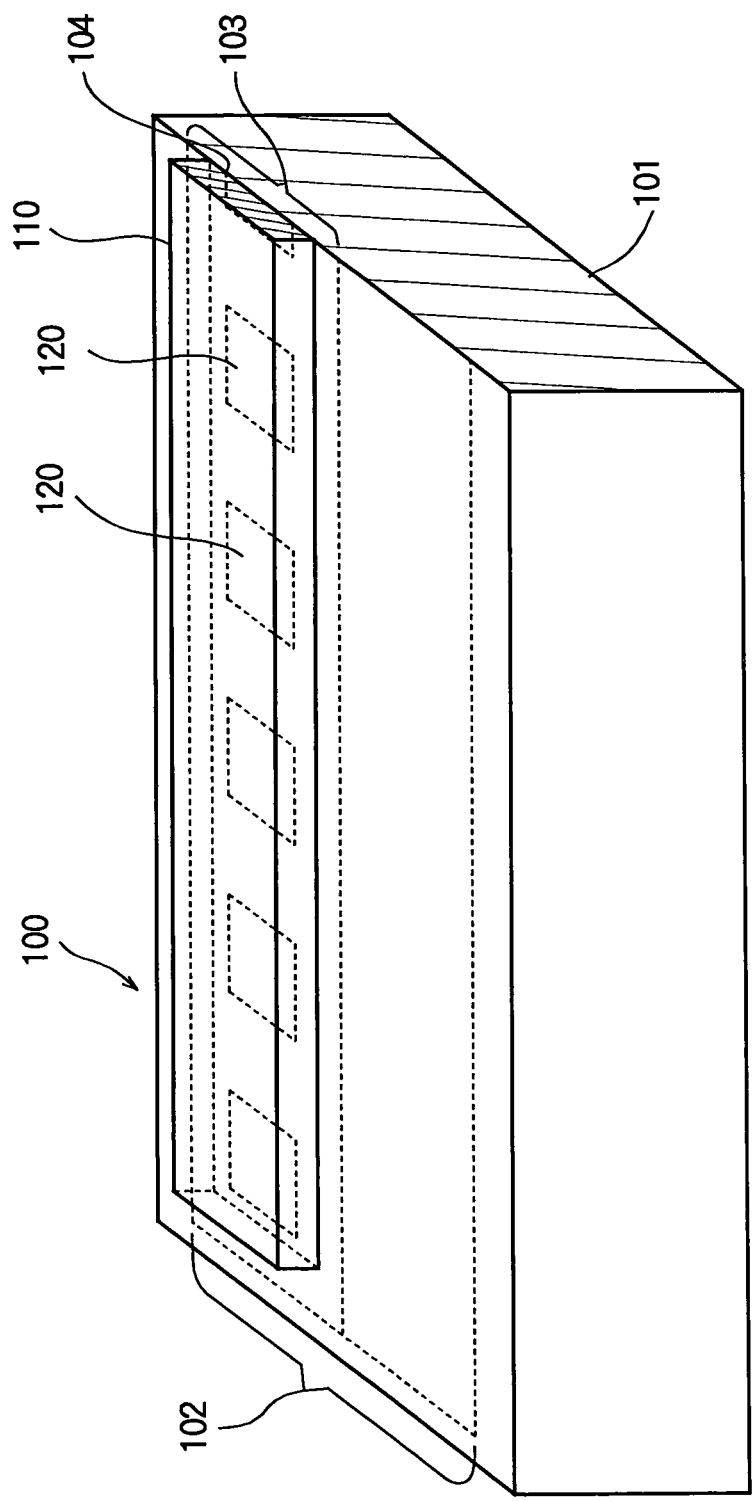
FIG. 1 is a perspective view schematically showing a part of an integrated LED/driving-IC chip in accordance with a first embodiment of the present invention.

Embodiments of the invention will now be described with reference to the attached drawings, in which like elements are indicated by like reference characters.

First Embodiment

Figure 2:
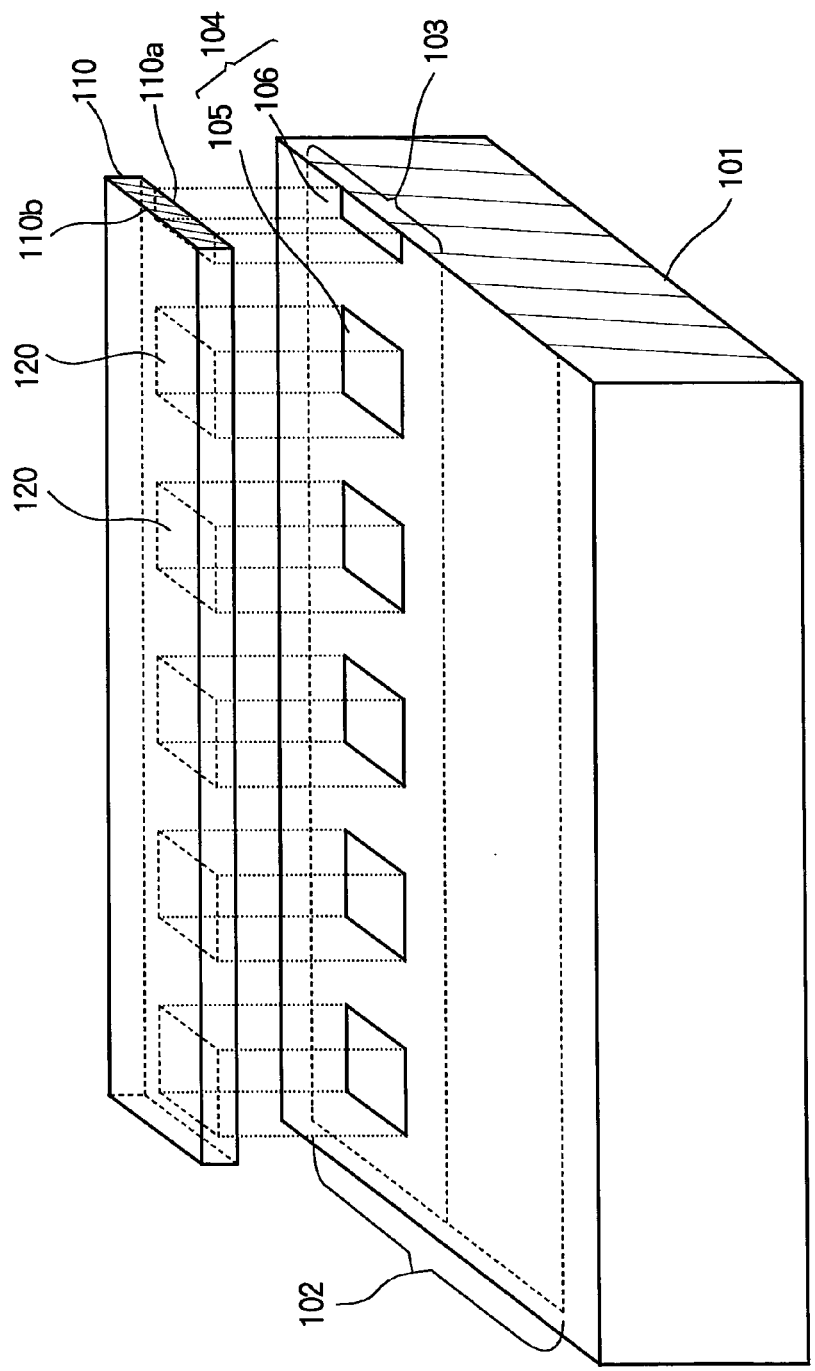
FIG. 2 is a perspective view schematically showing a part of the integrated LED/driving-IC chip of the first embodiment before an LED epitaxial film is bonded.
Figure 3:
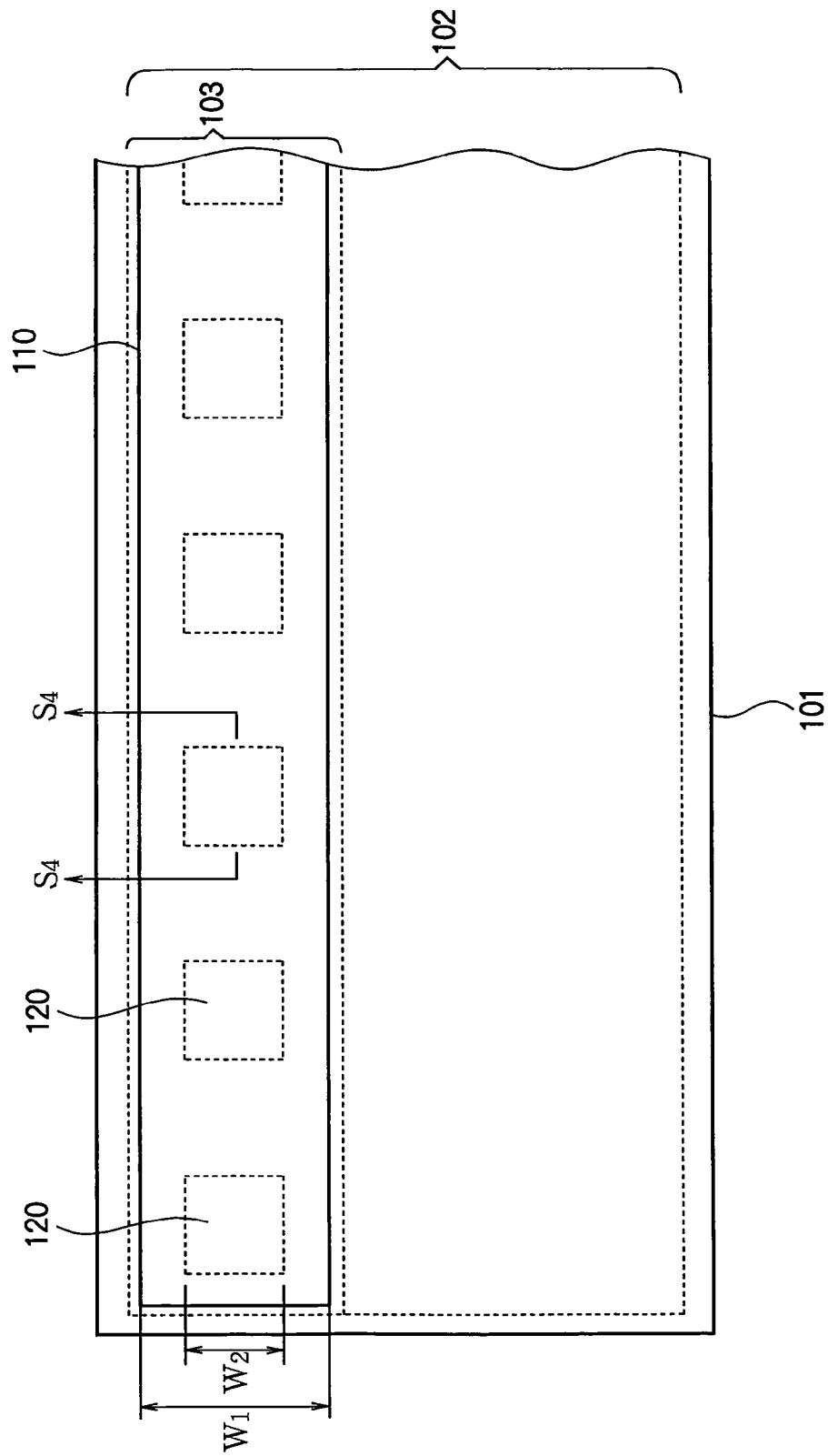
FIG. 3 is a plan view schematically showing a part of the integrated LED/driving-IC chip of the first embodiment.
Figure 4:
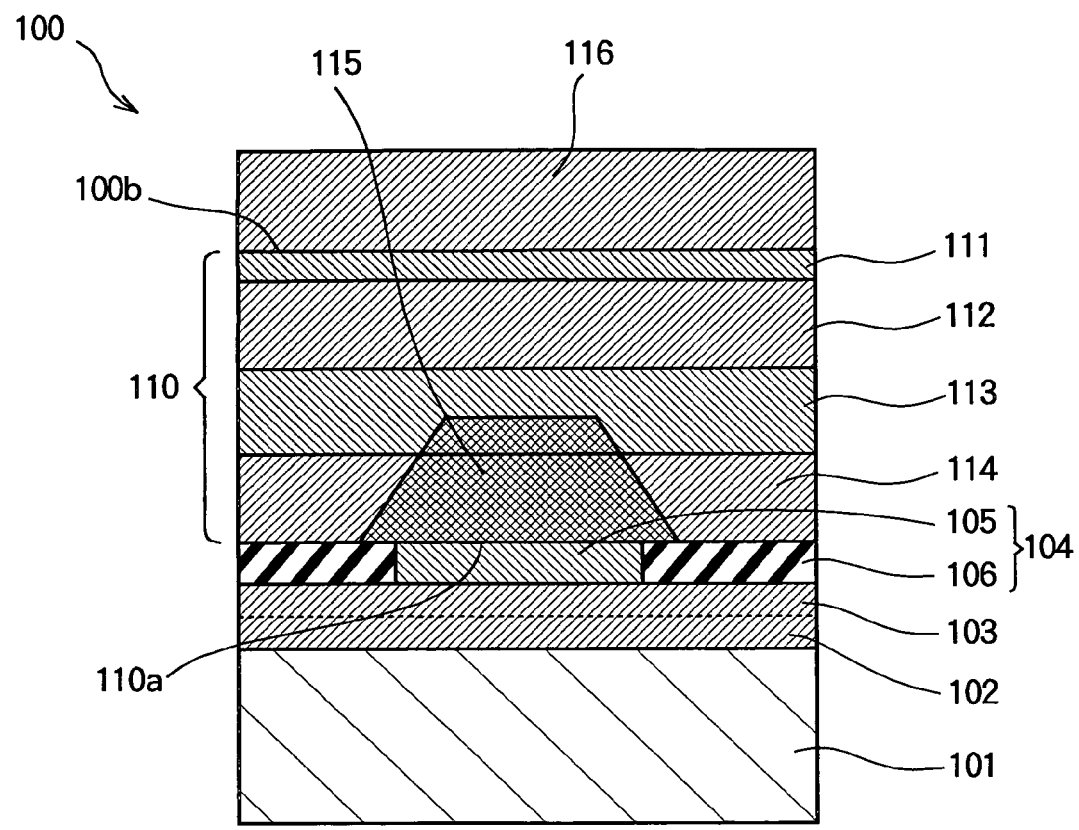
FIG. 4 is a schematic cross sectional view showing a cross section through line $S_4$-$S_4$ in FIG. 3.

FIG. 1 is a perspective view schematically showing a part of an integrated LED/driving-IC chip 100 as a combined semiconductor apparatus in accordance with a first embodiment of the present invention, and FIG. 2 is a perspective view schematically showing the integrated LED/driving-IC chip 100 before an LED epitaxial film 110 is bonded. FIG. 3 is a plan view schematically showing a part of the integrated LED/driving-IC chip 100, and FIG. 4 is a schematic cross sectional view showing a cross section through line $S_4$-$S_4$ in FIG. 3.

As shown in FIGS. 1 to 4, an integrated LED/driving-IC chip 100 of the first embodiment includes a silicon (Si) substrate 101 as a semiconductor substrate which has an integrated circuit 102 and a planarized region 103 formed in a surface of the Si substrate 101. The planarized region 103 is obtained by forming a dielectric layer (not shown in the figures) on the surface of the Si substrate 101 and then subjecting the surface of the Si substrate 101 to a planarizing process such as chemical mechanical polishing (CMP). Although the planarized region 103 is formed on the integrated circuit 102 of the Si substrate 101 in the first embodiment, the planarized region 103 may be formed in a region of the Si substrate 101 adjacent to the integrated circuit 102.

As shown in FIGS. 1 to 4, further, the integrated LED/driving-IC chip 100 of the first embodiment also includes a planarized film 104 disposed on the planarized region 103. The planarized film 104 has a metal layer 105 and an interdielectric layer 106 formed in a region peripheral to the metal layer 105. An upper surface of the planarized film 104 is subjected to a planarizing process such as CMP.

As shown in FIGS. 1 to 4, the integrated LED/driving-IC chip 100 further includes a sheet-like semiconductor epitaxial film 110 including LEDs 120 and bonded on the upper surface of the planarized film 104. In this connection, the planarized film 104 may be omitted and the LED epitaxial film 110 may be bonded directly on the surface of the planarized region 103.

The LED epitaxial film 110 is formed with a plurality of LEDs (also referred to below as light-emitting parts or regions) 120. The plurality of LEDs 120 is arranged in a row at regular intervals. However, the arrangement of the LEDs 120 is not limited to the regular intervals. Further, the arrangement of the LEDs 120 is not limited to a single row, but the LEDs 120 may be arranged as regularly shifted in a direction perpendicular to a direction of the arrangement of the LEDs 120. Furthermore, number of LEDs 120 to be formed to the LED epitaxial film 110 is not limited to the illustrated number. Further, as shown in FIG. 3, the LED epitaxial film 110 has a width $W_1$ larger than a width $W_2$ of the light-emitting region 120. For example, the width $W_2$ of the light-emitting region 120 is set to be 20 μm, and the width $W_1$ of the LED epitaxial film 110 is set to be 50 μm, so that a margin of 15 μm is provided to each of both sides of the light-emitting region 120. The width $W_1$ of the LED epitaxial film 110 is much smaller than width (typically, about 400 μm) of a substrate of the conventional LED print head having electrode pads. However, the width $W_1$ of the LED epitaxial film 110 and the width $W_2$ of the light-emitting region 120 are not limited to the aforementioned values.

It is desirable that the LED epitaxial film 110 will be made of only epitaxial layers to be explained later. The thickness of the LED epitaxial film 110 may be about 2 μm that is sufficient to secure stable characteristics (e.g., light-emitting characteristics or electrical characteristics) of the LED 120. The thickness of the LED epitaxial film 110 is much smaller than the thickness (typically, about 300 μm) of the conventional LED print head. As the thickness of the LED epitaxial film 110 is increased, a disconnection due to poor step coverage tends to probably occur in the thin-film wiring layer (e.g. the layer 130 shown in FIG. 6) formed on the LED epitaxial film 110. In order to avoid occurrence of the disconnection, it is desirable that the LED epitaxial film 110 have a thickness of about 10 μm or less. In this connection, by taking measures, e.g., to planarize the stepped zone with use of insulating material such as polyimide, it is also possible to set the thickness of the LED epitaxial film 110 to exceed 10 μm.

The Si substrate 101 is a monolithic Si substrate, in which the integrated circuit 102 is formed. The integrated circuit 102 includes a plurality of driving-ICs for driving the LEDs 120 formed in the LED epitaxial film 110. Besides the driving circuits, the integrated circuit 102 includes shared circuitry for illumination control of the LEDs 120. The Si substrate 101 has a thickness of about 300 μm, for example. The integrated circuit 102 of the Si substrate 101 has a rough or irregular surface due to the openings of the interdielectric layer, wiring pattern, etching pattern, etc. A dielectric layer (not shown in the figures) is formed on the irregular surface of the integrated circuit 102 and then subjected to a planarizing process such as CMP, thus forming the planarized region 103.

The planarized film 104 disposed on the planarized region 103 includes a plurality of the metal layers 105 formed on predetermined regions on which the LEDs 120 of the LED epitaxial film 110 are to be bonded, and the interdielectric layer 106 formed on the peripheral region of the metal layers 105 to have the same thickness as that of the metal layers 105. However, the structure and material of the planarized film 104 are not restricted to the illustrated or above-described ones. The structure and material of the planarized film 104 may be determined by various factors including the structure and material of the planarized region 103 of the Si substrate 101, and the shape, size, thickness and material of the LED epitaxial film 110.

FIGS. 5A and 5B are schematic cross sectional views for explaining a process of forming the planarized film 104. When forming the planarized film 104, as shown in FIG. 5A, an interconnecting layer 105a, an interdielectric layer 106a and a metal layer 105b are sequentially formed on the planarized region 103 of the Si substrate 101. Next, as shown in FIG. 5B, the interdielectric layer 106a and metal layer 105b are subjected to a planarizing process such as CMP (Chemical Mechanical Polishing) to planarize surfaces of the metal layers 105 and interdielectric layer 106. In this way, the planarized film 104 is formed on the planarized region 103.

However, the structure of the planarized film 104 and a method of forming the planarized film 104 are not restricted to the aforementioned structure and method. Instead of the aforementioned planarizing method, a spin-on-glass (SOG) method, which is generally used for forming a surface protective film of an IC or an LSI, may be used for forming a planarized film on the Si substrate 101. The SOG method includes, for example, the steps of dropping ether-series solvent with dissolved organic silicon onto the Si substrate 101, rotating the Si substrate 101 at a high speed to form a uniform and thin SOG film on the Si substrate 101, and subsequently heating the Si substrate 101 at a range between 300 to 500 degrees centigrade to remelt the SOG film for a certain period for hardening the SOG film. In the illustrated example, the interdielectric layer 106a is made of an insulating film such as an oxide film or a nitride film made of, e.g., $SiO_2$, SiN or polyamide. The metal layer 105 is made of, e.g., palladium or gold or metal material including palladium and/or gold. The metal layer 105 may be a conduction layer of electrically conductive material (such as polysilicon) other than metal. Furthermore, flatness (which is an indicator used for indicating unevenness on the surface) of the planarized region 103 is preferably not more than 10 nanometers. The smaller the value of flatness becomes, the more preferable the planarized region 103 becomes.

As shown in FIG. 2 or 4, the LED epitaxial film 110 has a first surface 110a, in which the LEDs 120 are formed, and a second surface 110b opposed to the first surface 110a and having a common electrode layer 116. In other words, the light-emitting parts 120 are positioned in the first surface 110a in the LED epitaxial film 110. In the first embodiment, the first surface 110a of the LED epitaxial film 110 is located on the side of the planarized region 103. As shown in FIG. 2, the LED epitaxial film 110 is bonded on the planarized film 104 in such a way that the plurality of LEDs 120 are in contact with the associated metal layers 105.

Next, cross sectional structure of the integrated LED/driving-IC chip 100 will be described. As shown in FIG. 4, the integrated LED/driving-IC chip 100 has a structure in which sequentially laminated are the Si substrate 101, the integrated circuit 102, the planarized region 103, the planarized film 104, the LED epitaxial film 110, and a common electrode layer 116. More specifically, the planarized region 103 is formed on the integrated circuit 102 of the Si substrate 101, the planarized film 104 is formed on the planarized region 103, the first surface 110a provided with the LEDs 120 is disposed on the side of the planarized region 103 in the LED epitaxial film 110. The common electrode layer 116 may be made of an electrically conductive material, through which light can pass, such as a transparent oxide electrically conductive film. The transparent oxide electrically conductive film may be made of, e.g., indium tin oxide (ITO) or zinc oxide (ZnO).

As shown in FIG. 4, the LED epitaxial film 110 has a stacking layered structure of an n-type $Al_zGa_{1-z}As$ layer 114 ($0 \leq z \leq 1$), an n-type $Al_yGa_{1-y}As$ layer 113 ($0 \leq y \leq 1$), and an n-type $Al_xGa_{1-x}As$ layer 112 ($0 \leq x \leq 1$), and an n-type GaAs layer 111. A Zn diffusion region 115 is formed in the n-type $Al_yGa_{1-y}As$ layer 113 and n-type $Al_zGa_{1-z}As$ layer 114. The common electrode layer 116 is formed on the n-type GaAs layer 111.

The n-type GaAs layer 111 has a thickness of about 10 nm (=0.01 μm), the n-type $Al_xGa_{1-x}As$ layer 112 has a thickness of about 0.5 μm, the n-type $Al_yGa_{1-y}As$ layer 113 has a thickness of about 1 μm, and the n-type $Al_zGa_{1-z}As$ layer 114 has a thickness of about 0.5 μm. In this case, the thickness of the LED epitaxial film 110 becomes about 2 μm. However, the thicknesses of the above layers are not limited to the above values. Further, the material of the LED epitaxial film 110 may be replaced by other material such as $(Al_xGa_{1-x})_yIn_{1-y}P$, where $0 \leq x \leq 1$ and $0 \leq z \leq 1$, in this case, GaN, AlGaN, or InGaN.

The aluminum composition ratios x, y, z of the AlGaAs layers are preferably selected so that x>y and z>y (e.g., x=z=0.4, y=0.1), and the diffusion front of the zinc diffusion region 115 is preferably located within the n-type $Al_yGa_{1-y}As$ active layer active 113. In this structure, minority carriers injected through the pn junction are confined within the n-type $Al_yGa_{1-y}As$ active layer 113 and the p-type $Al_yGa_{1-y}As$ region created therein by zinc diffusion, so that high luminous efficiency is obtained. The structure shown in FIG. 4 enables high luminous efficiency to be obtained with an LED epitaxial film 110 as thin as about 2 μm.

The LED epitaxial film 110 is not limited to thicknesses or materials given above. Other materials, such as an aluminum-gallium indium phosphide ($(Al_xGa_{1-x})_yIn_{1-y}P$, where $0 \leq x \leq 1$ and $0 \leq y \leq 1$, a gallium nitride (GaN), an aluminum gallium nitride (AlGaN), and an indium gallium nitride (InGaN), may also be employed. Other than a double hetero-epitaxial structure described in FIG. 4, a single hetero-epitaxial structure and a homo-epitaxial structure can be also applied in LEDs.

Shown in FIG. 6 is a schematic plan view of a part of the integrated LED/driving-IC chip 100 after common interconnecting layers 130 are formed. The common interconnecting layers 130 are electrically connected to associated common electrode terminals 107 of the integrated circuit 102 of the Si substrate 101. The Zn diffusion region 115 shown in FIG. 4) is electrically connected to the metal layer or conductive layer 105. The metal layer 105 is electrically connected to the integrated circuit 102 (not shown in the figure). The common interconnecting layer 130 is, for example, a thin metal wiring film. Specific examples of suitable films of the individual interconnecting layers 130 include (1) a film containing gold (Au), e.g., a single-layer gold film, a multi-layer film with titanium, platinum, and gold layers (a Ti/Pt/Au film), a multi-layer film with gold and zinc layers (an Au/Zn film), or a multi-layer film with a gold layer and a gold-germanium-nickel layer (an AuGeNi/Au film); (2) a film containing palladium (Pd), e.g., a single-layer palladium film or a multi-layer film with palladium and gold layers (a Pd/Au film); (3) a film containing aluminum (Al), e.g., a single-layer aluminum film or a multi-layer film with aluminum and nickel layers (an Al/Ni film); (4) a polycrystalline silicon (polysilicon) film; (5) a thin, electrically conductive oxide film such as an indium tin oxide (ITO) film or a zinc oxide (ZnO) film. The common interconnecting layer 130 may be formed by photolithography.

An interdielectric thin film (not shown in the figures) is provided in a region where electric short-circuiting should be avoided, for example, between the common interconnecting layer 130 and top- and side-surface of the LED epitaxial films 110, between the common interconnecting layer 130 and the integrated circuit, or the like, thereby securing normal operation. The common interconnecting layer 130 must cross steps, such as the step at the edge of the LED epitaxial film 110 or the integrated circuit 102 area. To prevent short- and open-circuit faults in the common interconnecting layers 130 at the steps, the interlayer dielectric film is preferably formed by a method such as a plasma chemical vapor deposition (P-CVD) method that provides good step coverage. The steps may also be planarized with a polyimide film, a spin-on-glass film, or other interdielectric thin film (e.g., silicon oxide or silicon nitride).

Next, a fabrication process for the LED epitaxial film 110 will be described with reference to FIGS. 7 to 10, which are schematic cross sectional views for explaining process of fabricating an LED epitaxial film 110 of the first embodiment. Further, FIG. 9 shows a cross section through line $S_9$-$S_9$ in FIG. 10, and FIG. 10 shows a cross section through line $S_{10}$-$S_{10}$ in FIG. 9.

Figure 7:
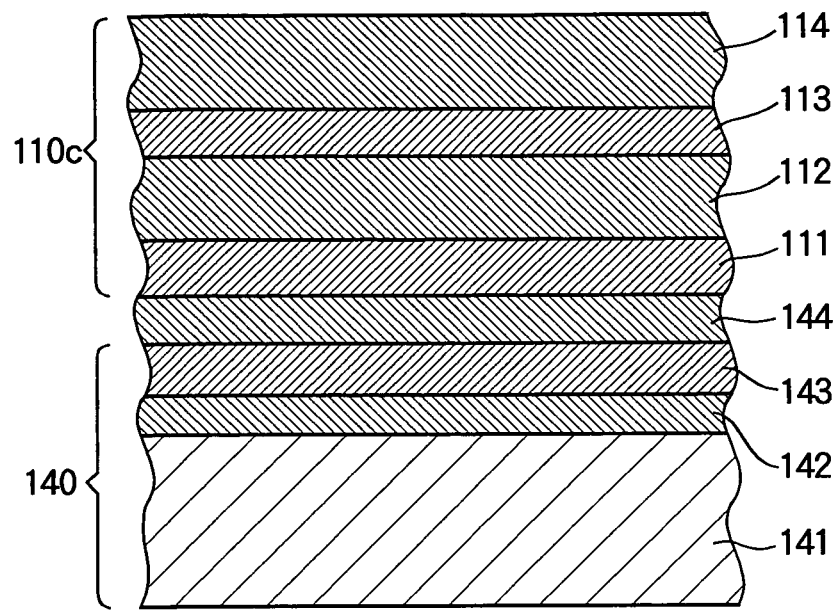
FIG. 7 is a schematic cross sectional view for explaining a first process of fabricating an LED epitaxial film of the first embodiment.

An LED epitaxial layer 110c can be fabricated by the techniques such as metal organic chemical vapor deposition (MOCVD) or molecular beam epitaxy (MBE). After lifting off the LED epitaxial layer 110c, it becomes the LED epitaxial film 110. Before fabricating the LED epitaxial layer 110c, as shown in FIG. 7, the LED epitaxial film fabrication substrate 140 is formed. The fabrication substrate 140 in FIG. 7 includes a GaAs substrate 141, a GaAs buffer layer 142, an aluminum-gallium indium phosphide ((AlGa)InP) etching stop layer 143, and an aluminum arsenide (AlAs) sacrificial layer 144. The n-type GaAs contact layer 111, n-type $Al_xGa_{1-x}As$ lower cladding layer 112, n-type $Al_yGa_{1-y}As$ active layer 113, and n-type $Al_zGa_{1-z}As$ upper cladding layer 114 are formed in this order on the AlAs sacrificial layer 144, creating an LED epitaxial layer 110c. Lifting-off of the LED epitaxial layer 110c can be carried out by a chemical lift off method. In this case, the (AlGa)InP etching stop layer 143 can be omitted. Further, the structures of the semiconductor epitaxial layer 110c and the fabrication substrate 140 are not limited to those shown in FIG. 7, and various modifications of the LED epitaxial layer 110c and the fabrication substrate 140 can be made.

Figure 8:
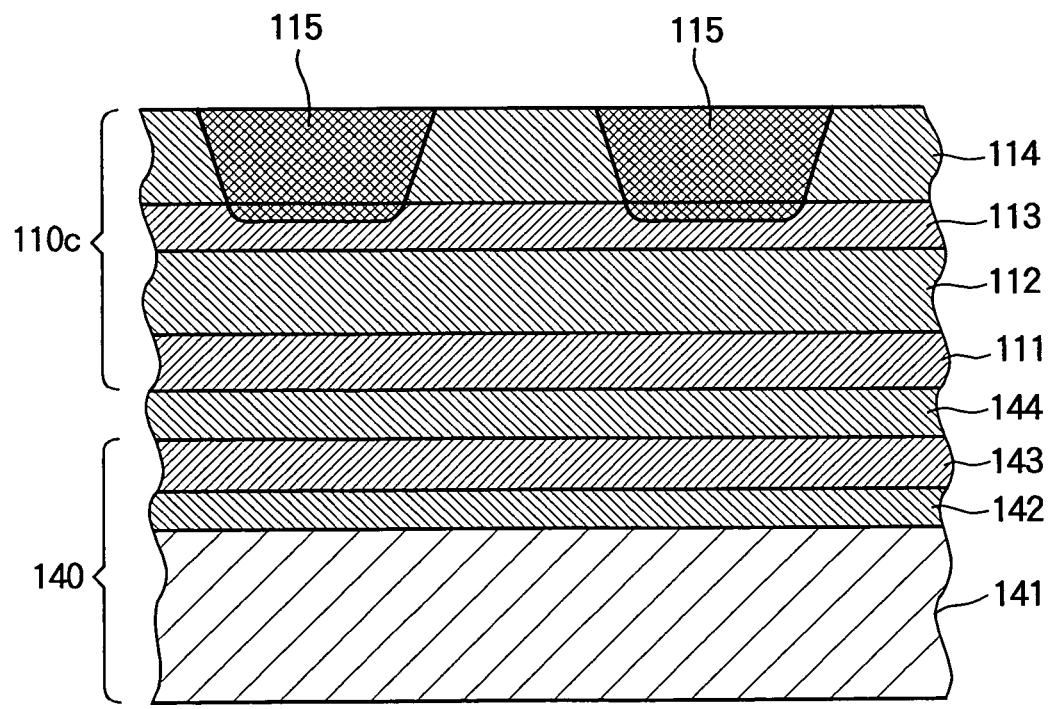
FIG. 8 is a schematic cross sectional view for explaining a second process of fabricating the LED epitaxial film in the first embodiment.

Referring to FIG. 8, a p-type impurity comprising zinc (Zn) is diffused by, for example, a solid-phase diffusion method to create the zinc diffusion regions 115. The diffusion source film (not shown in the figures) used for the solid-phase diffusion process is then removed to expose the surface of the zinc diffusion regions 115.

Figure 9:
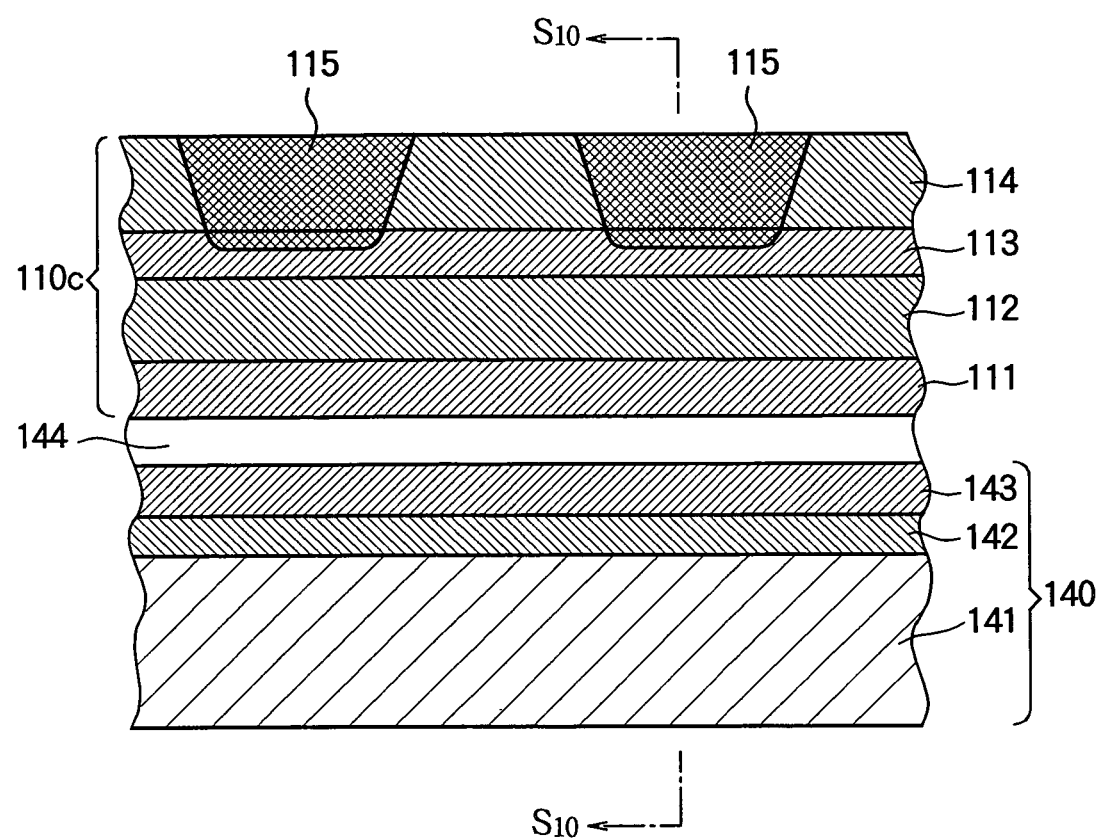
FIG. 9 is a schematic cross sectional view for explaining a third process of fabricating the LED epitaxial film in the first embodiment.

As shown in FIGS. 9 and 10, the AlAs sacrificial layer 144 is selectively removed with use of a 10% HF (hydrogen fluoride) solution. Since an etching rate for the AlAs sacrificial layer 144 is much larger than an etching rate for the AlGaAs layers 112 to 114, GaAs layers 111, 141, 142, and etching stop layer 143; the AlAs sacrificial layer 144 can be selectively etched. As a result, the LED epitaxial layer 110c (LED epitaxial film 110) can be lifted off from the LED epitaxial film fabrication substrate 140.

In this connection, for the purpose of making the LED epitaxial film 110 thin and also to lift off the LED epitaxial film 110 from the fabrication substrate 140 in a comparative short time, it is desirable that the LED epitaxial film 110 have a width of 300 μm or less, e.g., about 50 μm. To this end, as shown in FIG. 10, the respective epitaxial layers 111 to 114 are previously etched so that trenches 145 are made therein and the layers have a width $W_1$ of 50 μm. The formation of the trenches 145 are carried out by photolithography for masking the epitaxial layers with use of resist for the trench formation and etching the epitaxial layers using a phosphate peroxide etchant (i.e., a solution of phosphoric acid and hydrogen peroxide). For simplicity, only one trench 145 is shown in FIG. 10. The phosphate peroxide etchant etches the AlGaAs layers 112 to 114 and GaAs layers 111, 141, 142. However, since the etching rate of the etchant for the etching stop layer 143 is low, the trench 145 formed from the upper surface can be prevented from arriving at the GaAs substrate 141 during the etching. After the trench 145 is formed, the AlAs sacrificial layer 144 is etched using the HF solution and then the LED epitaxial film 110 is lifted off. Although the AlAs sacrificial layer 144 is illustrated as still remain (as etched halfway) in FIG. 10, the AlAs sacrificial layer 144 is completely removed in such a condition as to carry the LED epitaxial film 110. After the AlAs sacrificial layer 144 has been completely removed by etching, the LED epitaxial film 110 is immersed in deionized water so that no etching solution residue remains. When lifting off the LED epitaxial film 110, a supporting material for carrying and protecting the LED epitaxial film can be provided on the LED epitaxial film 110. For example, when the supporting material is provided on the LED epitaxial film 110, the supporting material can be transferred to a predetermined position by sucking the surface of the supporting material for the LED epitaxial film by vacuum suction or bonding the surface of the supporting material for the LED epitaxial film by a photo-hardening adhesive sheet, which hardens and loses its adhesive property when subjected to light irradiation.

Figure 11A:
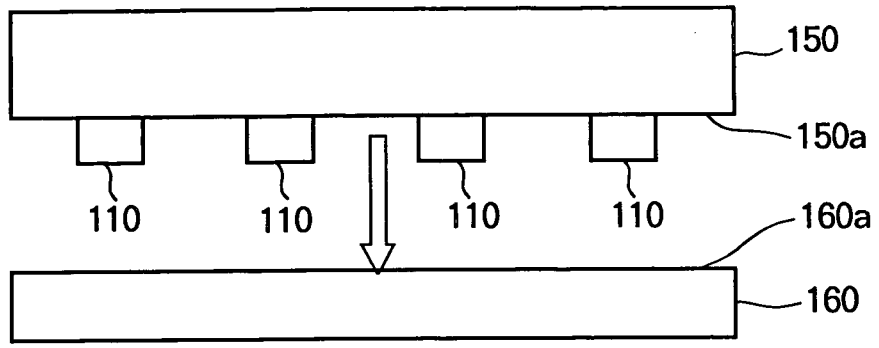
FIGS. 11A to 11D are schematic cross sectional views for explaining a process of bonding the LED epitaxial in the first embodiment.
Figure 11B:
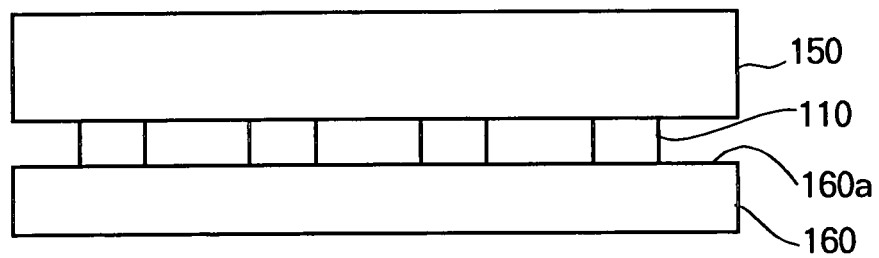
Figure 11C:
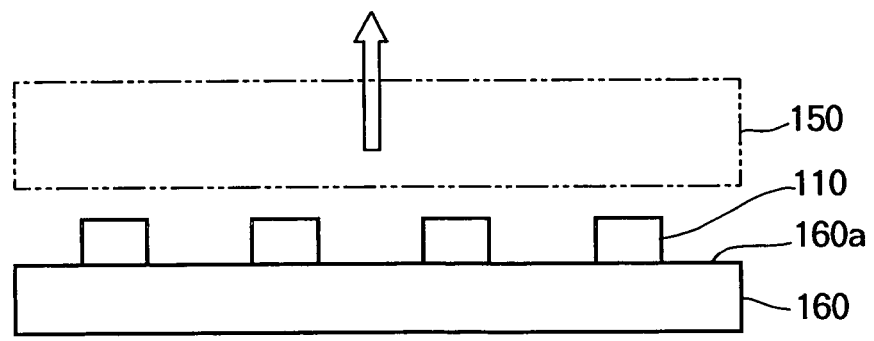
Figure 11D:
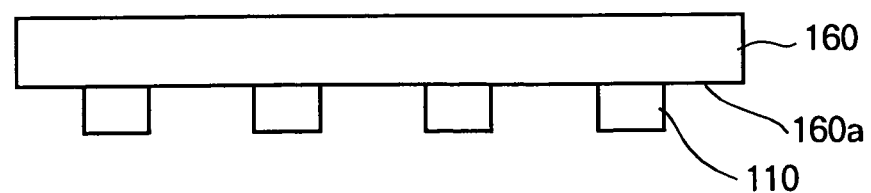

FIGS. 11A to 11D are schematic cross sectional views for explaining a process of bonding the LED epitaxial film 110 in the integrated LED/driving-IC chip of the first embodiment. As shown in FIG. 11A, the LED epitaxial film 110 (corresponding to the LED epitaxial layer 110c in FIGS. 9 and 10 before lifting-off) is lifted from the fabrication substrate 140 and carried by a photo-hardening adhesive sheet 150a of a first supporting material 150, and, as shown in FIG. 11B, is bonded onto a photo-hardening adhesive sheet 160a of a second supporting material 160. Next, light irradiation such as UV irradiation on the photo-hardening adhesive sheet 150a of the first supporting material 150 causes the sheet 150a to lose its adhesive property. Thereafter, the second supporting material 160 is located upside down so that the LED epitaxial film 110 is at a lower position as shown in FIG. 11D. In this condition, the LED epitaxial film 110 is bonded onto the planarized region 103 (or onto the planarized film 104 formed on the planarized region 103) of the Si substrate 101, and then subjected to light irradiation (e.g., UV irradiation) to lose the adhesive property of the photo-hardening adhesive sheet 160a of the second supporting material 160 and to lift the second supporting material 160 therefrom.

As mentioned above, the integrated LED/driving-IC chip 100 of the first embodiment is arranged so that the planarized region 103 is formed on the surface of the integrated circuit 102 of the Si substrate 101, the planarized film 104 is formed on the planarized region 103, and the LED epitaxial film 110 is bonded onto the planarized film 104. As a result, the need for providing the wire bond electrode pad for wire bonding to the LED epitaxial film 110 can be eliminated. In the integrated LED/driving-IC chip 100 of the first embodiment, further, since the common interconnecting layer 130 is formed as a thin film by photolithography, the need for providing the wire bond electrode pad for the common electrode to the LED epitaxial film 110 can also be eliminated. As a result, the surface area of the LED epitaxial film 110 can be made small and thus the integrated LED/driving-IC chip 100 can be made small in size. In addition, since the surface area of the LED epitaxial film 110 can be made small, its material cost can be reduced.

In the integrated LED/driving-IC chip 100 of the first embodiment, since the LED epitaxial film 110 is supported by the Si substrate 101 and need not be thickened to provide strength for wire bonding, it can be much thinner than a conventional LED array chip. This effect lead to a substantial reduction in material costs.

In the integrated LED/driving-IC chip 100 of the first embodiment, further, the first surface 110a of the LED epitaxial film 110 provided with the LEDs 120 is located on the side of the Si substrate 101 provided with the planarized region 103 and overlapped with the metal layer 105. Thus the need for providing individual interconnecting lines for connection of the LEDs 120 to the integrated circuit 102 can be eliminated and the arrangement and fabricating process can be simplified.

In the integrated LED/driving-IC chip 100 of the first embodiment, furthermore, since the LED epitaxial film 110 is provided on the planarized region 103 above the integrated circuit 102, the width of the Si substrate having the integrated circuit 102 can be reduced to a large extent.

In the integrated LED/driving-IC chip 100 of the first embodiment, in addition, since the plurality of common interconnecting layers 130 are arranged at regular intervals in a direction of a row of the LEDs, fluctuations in the potential of the common electrode layer 116 of the LED epitaxial film 110 can be made small and fluctuations in the luminous intensity of the LEDs 120 can be made small.

FIG. 12 is a cross sectional view schematically showing an integrated LED/driving-IC chip 170 as a combined semiconductor apparatus in accordance with a modification of the first embodiment of the present invention. In FIG. 12, parts that are the same as or correspond to those in FIG. 6 (first embodiment) are denoted by the same reference numerals. The integrated LED/driving-IC chip 170 shown in FIG. 12 is different from that shown in FIG. 6 in that the shape of a common interconnecting layer 131 is different from that of the common interconnecting layer 130 in FIG. 6. In the integrated LED/driving-IC chip 170 shown in FIG. 12, the common interconnecting layer 131 has such a shape as to spread nearly all over the LED epitaxial film 110 other than openings 131a on the LEDs 120. As the common interconnecting layer 131, a metal layer or a transparent electrode or a semi-transparent electrode can be used. In this case, fluctuations in the potential of the common electrode layer 116 of the LED epitaxial film 110 can be made small and fluctuations in the luminous intensities of the LEDs 120 can be made small.

Second Embodiment

Figure 13:
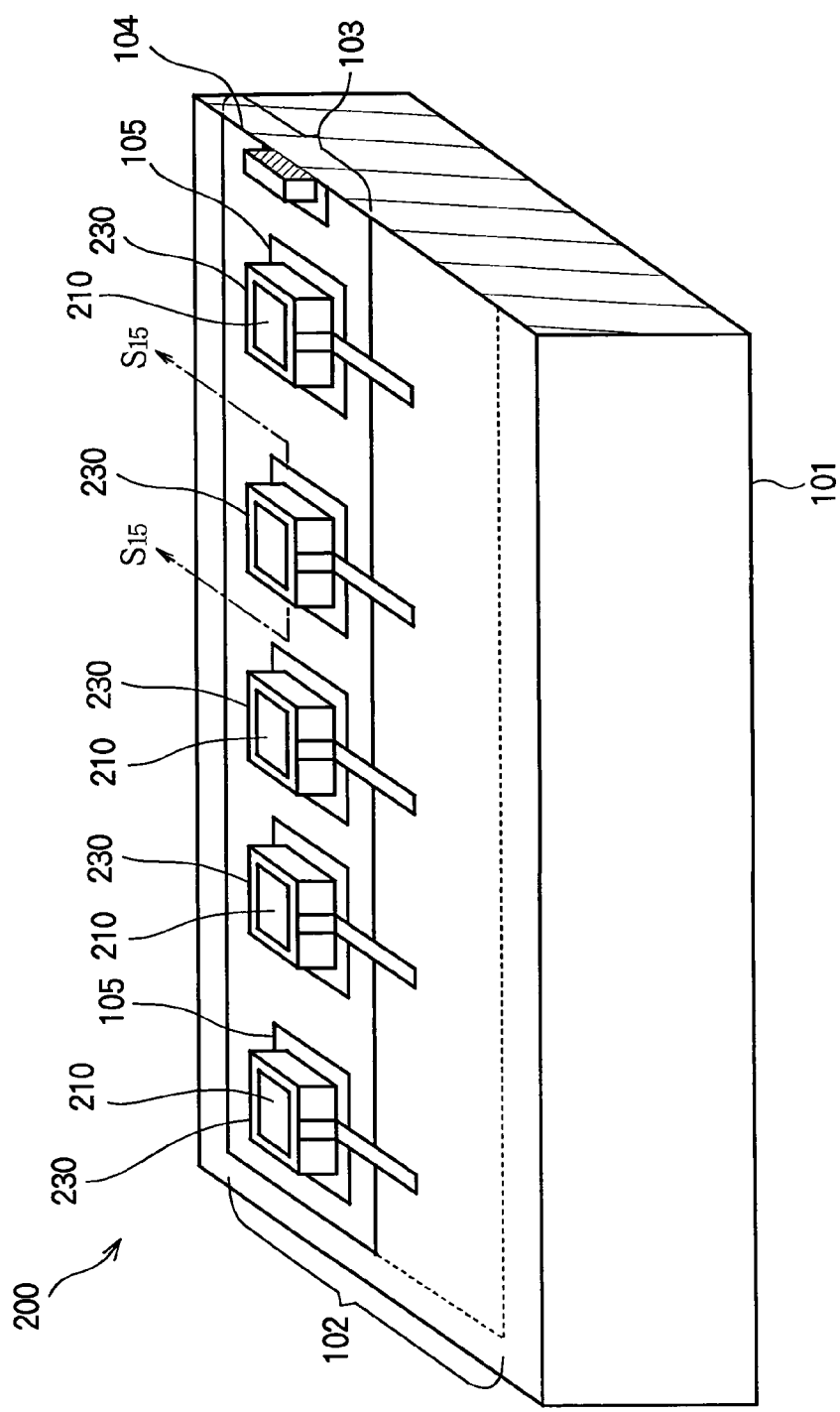
FIG. 13 is a perspective view schematically showing a part of an integrated LED/driving-IC chip in accordance with a second embodiment of the present invention.
Figure 14:
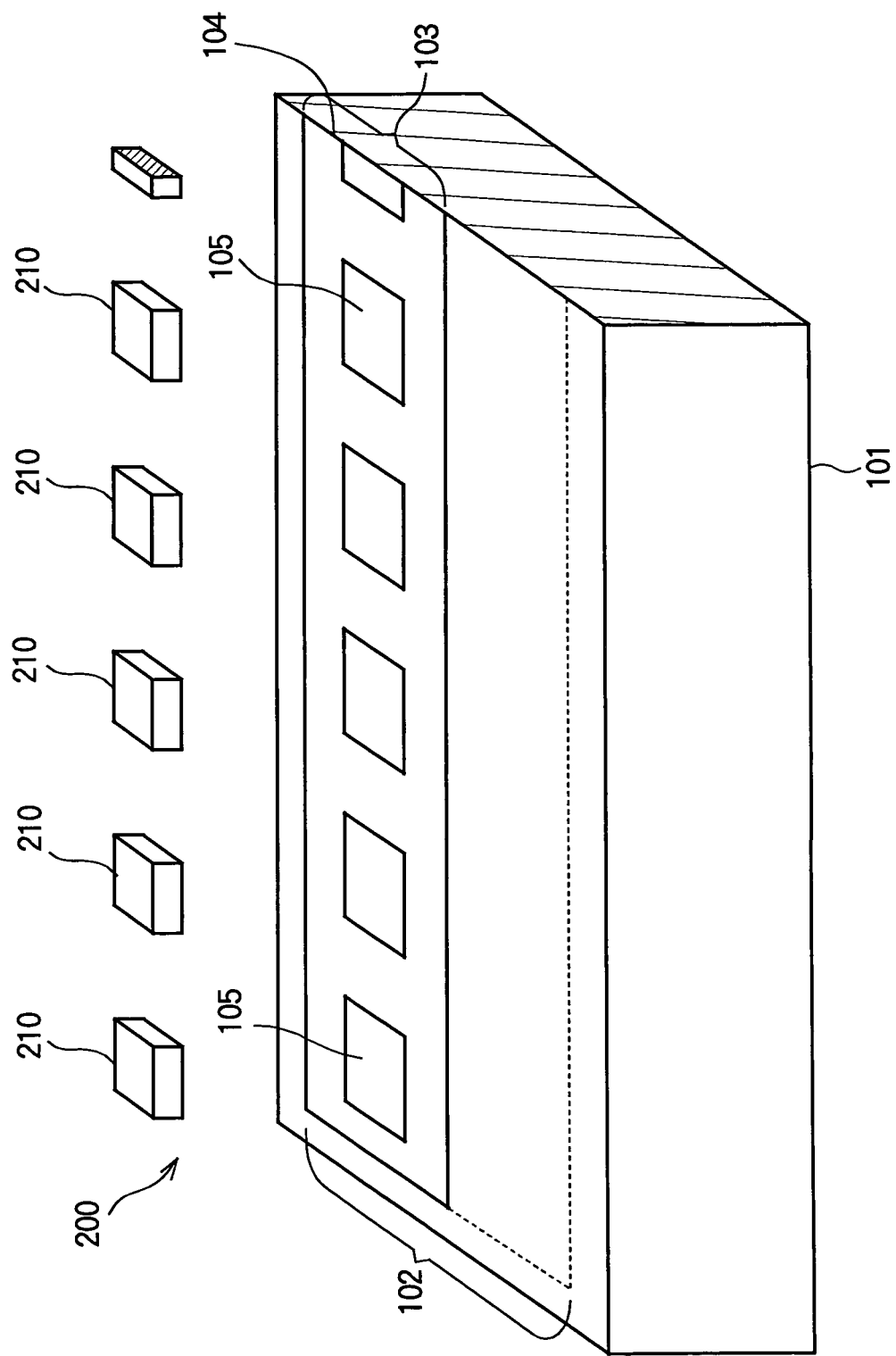
FIG. 14 is a schematic perspective view showing the integrated LED/driving-IC chip of the second embodiment before an LED epitaxial film is bonded.
Figure 15:
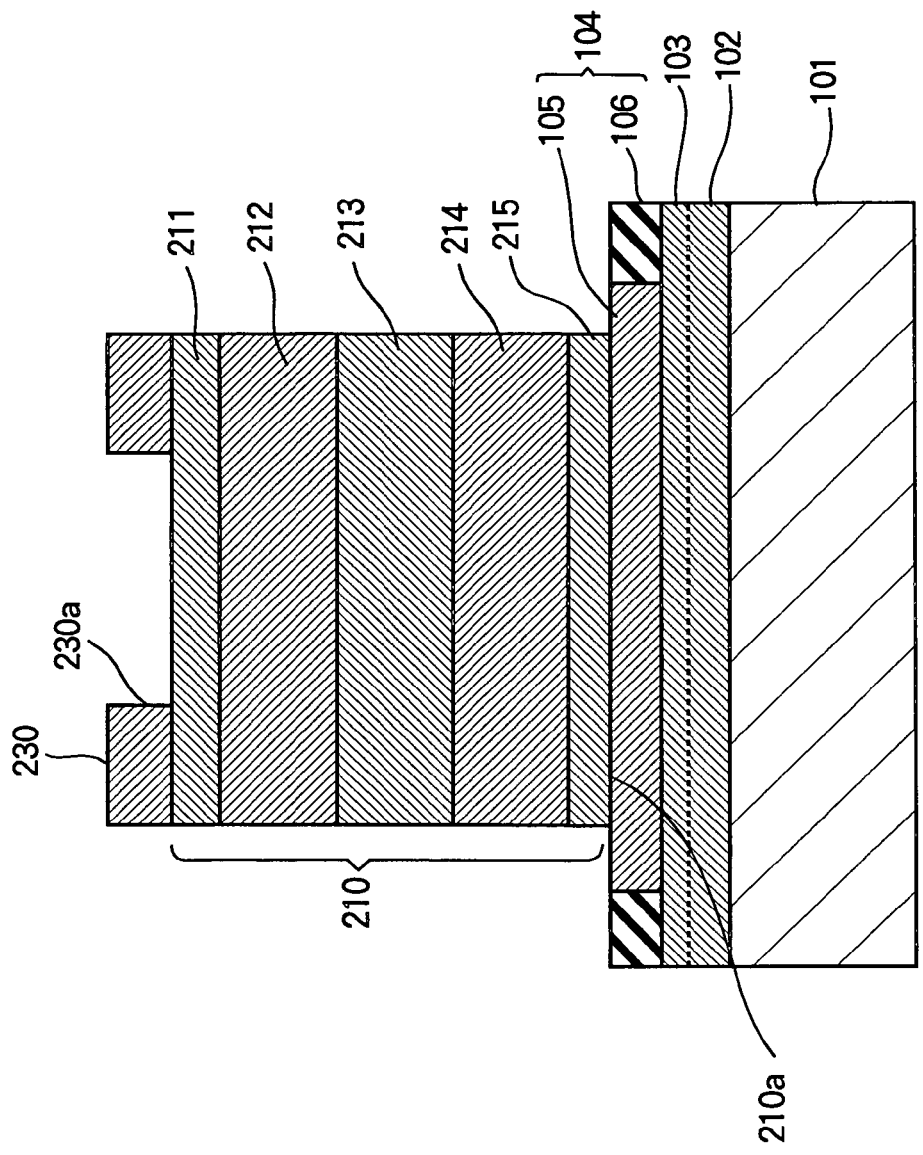
FIG. 15 is a schematic cross sectional view showing a cross section through line $S_{15}$-$S_{15}$ in FIG. 13.

FIG. 13 is a perspective view schematically showing a part of an integrated LED/driving-IC chip 200 in accordance with a second embodiment of the present invention, and FIG. 14 is a perspective view schematically showing the integrated LED/driving-IC chip 200 of the second embodiment before the LED epitaxial films 210 are bonded. FIG. 15 is a schematic cross sectional view showing a cross section through line $S_{15}$-$S_{15}$ in FIG. 13.

In FIG. 13, parts that are the same as or correspond to those in FIG. 1 (first embodiment) are denoted by the same reference numerals. In FIG. 14, parts that are the same as or correspond to those in FIG. 2 (first embodiment) are denoted by the same reference numerals. In FIG. 15, parts that are the same as or correspond to those in FIG. 4 (first embodiment) are denoted by the same reference numerals. An integrated LED/driving-IC chip 200 shown in FIGS. 13 and 14 is different from the integrated LED/driving-IC chip 100 of the first embodiment shown in FIGS. 1 and 2 in that a single LED epitaxial film 210 is bonded onto each metal layer 105 and that each LED epitaxial film 210 has a single LED.

As shown in FIG. 15, the LED epitaxial film 210 has a stacking layered structure in which a p-type $Al_xGa_{1-x}As$ layer 214, a p-type $Al_yGa_{1-y}As$ layer 213, an n-type $Al_zGa_{1-z}As$ layer 212 and an n-type GaAs layer 211 are sequentially grown on a p-type GaAs layer 215. When fabricating the LED epitaxial film 210, similarly to the first embodiment, the n-type GaAs layer 211, n-type $Al_zGa_{1-z}As$ layer 212, p-type $Al_yGa_{1-y}As$ layer 213, p-type $Al_xGa_{1-x}As$ layer 214 and p-type GaAs layer 215 are sequentially formed on an LED epitaxial film fabrication substrate. When bonding the LED epitaxial film 210, similarly to the first embodiment, the LED epitaxial film 210 is lifted off from the LED epitaxial film fabrication substrate, a first surface 210a of the LED epitaxial film 210 provided with the LEDs is located upside down so that the first surface 210a is located on the side of the planarized region 103, and the LED epitaxial film 210 is bonded onto the metal layers 105 on the Si substrate 101. Thereafter, a common interconnecting layer 230 having an opening 230a is formed. Similarly to the common interconnecting layer 130 in the first embodiment, the common interconnecting layer 230 is a thin interconnecting layer which extends from the surface of the common electrode area of the LED epitaxial film 210 to the surface of the common electrode terminal of the integrated circuit 102. The composition of each of the above layers can be set to satisfy a relation of x>y and z>y (e.g., x=z=0.4 and y=0.1). However, the structure and composition of the LED epitaxial film 210 are not limited to such those as mentioned above. The LED shown in FIG. 15 has a double hetero-junction structure, but it is also possible to fabricate LEDs with a single hetero-junction structure or a homojunction structure. Further, various types of structures including provision of nondoped active layer between cladding layers or insertion of a quantum-well layer between in the cladding layers can be employed. Such a modification as a p-type layer as the upper layer and an n-type layer as the lower layer is also possible.

As has been explained above, in the integrated LED/driving-IC chip 200 of the second embodiment, the LED epitaxial films 210 are divided to be small. As a result, a problem with the internal stress of the LED epitaxial films 210 involved when the thermal expansion coefficient of the LED epitaxial films 210 and the thermal expansion coefficient of the Si substrate 101 are largely different, can be reduced, and thus one of factors causing a defect in the LED epitaxial films 204 can be eliminated. For this reason, the integrated LED/driving-IC chip 200 of the second embodiment can be increased in reliability.

In the integrated LED/driving-IC chip 200 of the second embodiment, furthermore, the LED epitaxial films 210 are divided to be small and the bonding area is small. Thus a process of tightly bonding the LED epitaxial films 210 to the metal layers 105 can be facilitated, and therefore a defect generation rate caused by incomplete adhesion can be decreased.

In the integrated LED/driving-IC chip 200 of the second embodiment, further, since the LED epitaxial film 210 has only light-emitting regions, the width of the LED epitaxial film 210 can be made small and the length of the common interconnecting layer can be made short.

The second embodiment is substantially the same as the above first embodiment, except for the above-described respects.

Third Embodiment

Figure 16:
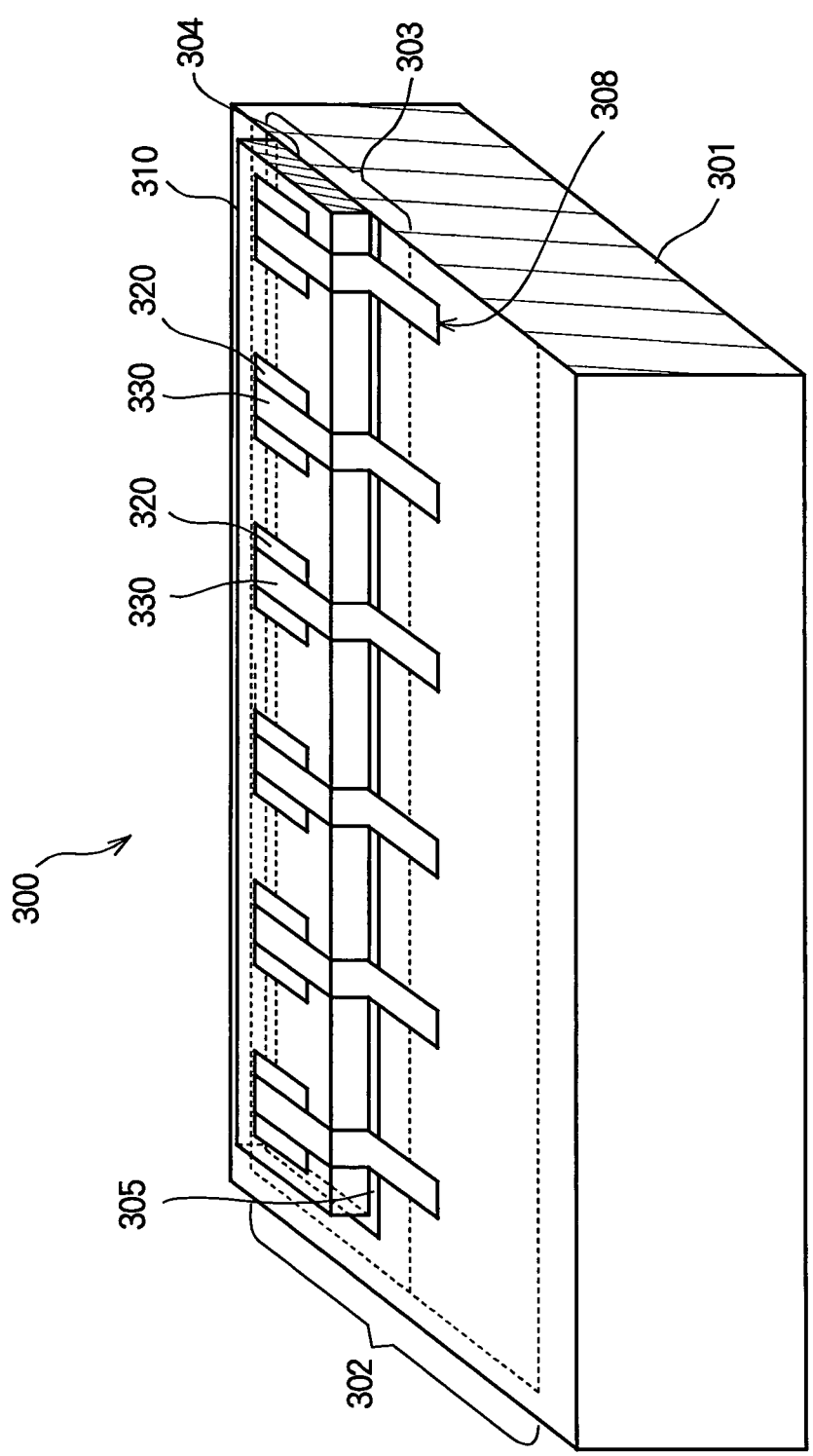
FIG. 16 is a perspective view schematically showing a part of an integrated LED/driving-IC chip in accordance with a third embodiment of the present invention.
Figure 17:
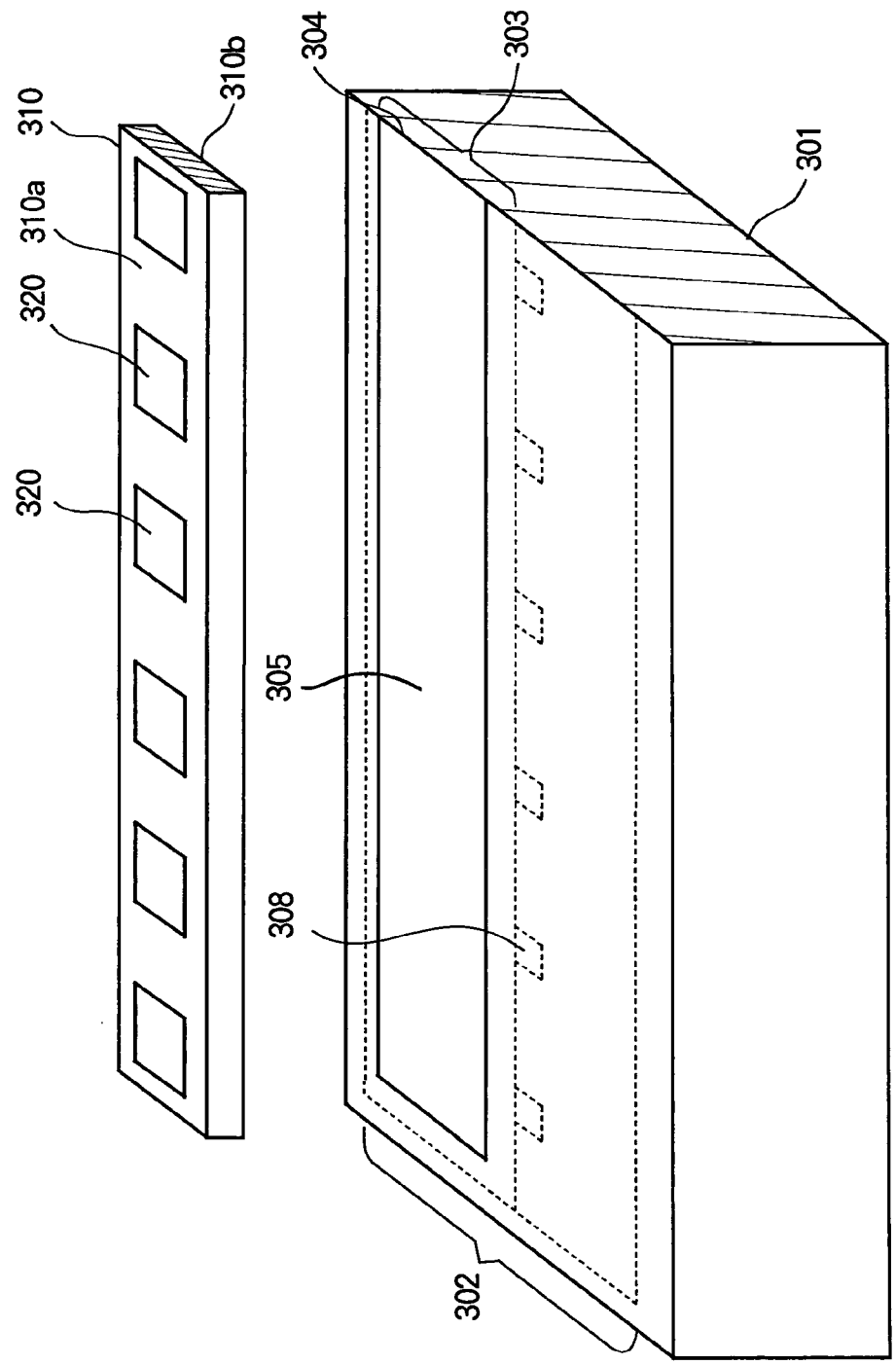
FIG. 17 is a perspective view schematically showing the integrated LED/driving-IC chip of the third embodiment before an LED epitaxial film is bonded.

FIG. 16 is a perspective view schematically showing a part of an integrated LED/driving-IC chip 300 in accordance with a third embodiment of the present invention, and FIG. 17 is a perspective view schematically showing the integrated LED/driving-IC chip 300 before an LED epitaxial film 310 is bonded. Further, FIG. 18 is a plan view schematically showing a part of the integrated LED/driving-IC chip 300.

Figure 18:
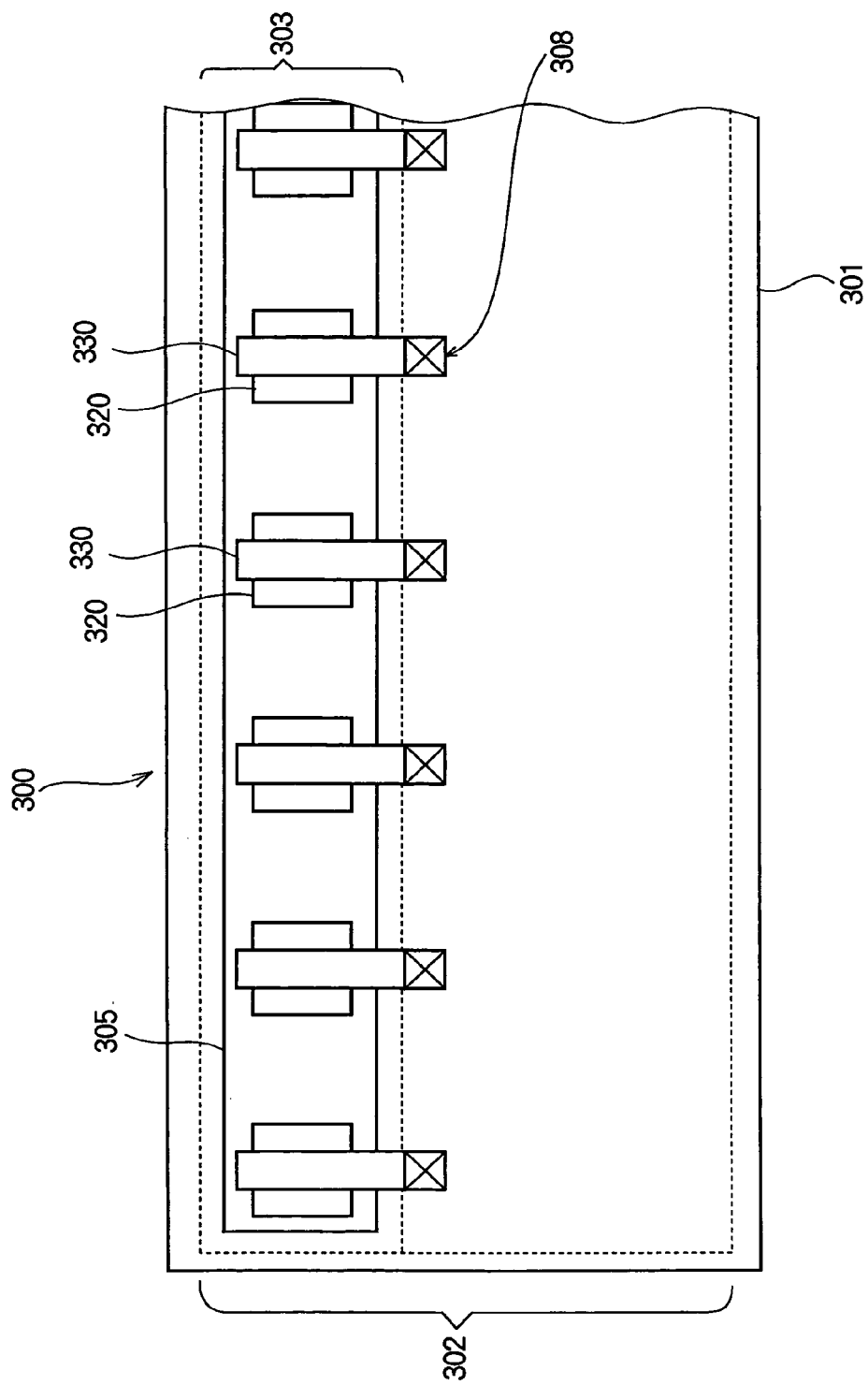
FIG. 18 is a plan view schematically showing a part of the integrated LED/driving-IC chip of the third embodiment.

As shown in FIGS. 16 to 18, an integrated LED/driving-IC chip 300 of the third embodiment includes an Si substrate 301 having an integrated circuit 302, a planarized region 303 formed in a surface of the Si substrate 301, and a planarized film 304 formed on the planarized region 303. The planarized region 303 is obtained by forming a dielectric layer (not shown in the figures) on the Si substrate 301 and subjecting the surface of the Si substrate 301 formed with the dielectric layer to a planarizing process such as CMP. Although the planarized region 303 is formed in a surface of the integrated circuit 302 of the Si substrate 301 in the third embodiment, the planarized region may be formed in a region of the Si substrate 301 adjacent to the integrated circuit 302. Further, the planarized film 304 in the third embodiment is a metal layer 305.

As shown in FIGS. 16 to 18, the integrated LED/driving-IC chip 300 a sheet-like LED epitaxial film 310 including the LEDs 320 and bonded on the planarized film 304. The LED epitaxial film 310 has a common interconnecting layer (not shown in FIGS. 16 to 18) on a second surface 310b of the LED epitaxial film 310 opposed to a first surface 310a, in which the LEDs 320 are formed. The second surface 310b of the LED epitaxial film 310 is positioned on the side of the planarized region 303 of the Si substrate 301 and bonded on the metal layer 305. In this connection, the planarized film 304 as the metal layer 305 may not be provided on the planarized region 303 of the Si substrate 301, and the LED epitaxial film 310 may be bonded directly on the surface (e.g., electrode area) of the planarized region 303 of the Si substrate 301.

As shown in FIGS. 16 to 18, the integrated LED/driving-IC chip 300 also includes thin individual interconnecting layers 330 formed on a region extending from the upper surfaces of the LEDs 320 of the LED epitaxial film 310 to the upper surfaces of individual electrode terminals 308 of the integrated circuit 302. Formed under the individual interconnecting lines 330 is a suitable interdielectric layer (not shown in the figures). The metal layer 305 is electrically connected to a common potential terminal provided on the substrate 301.

As has been explained above, in the integrated LED/driving-IC chip 300 of the third embodiment, since the second surface 310b of the LED epitaxial film 310 is bonded on the metal layer 305, a strong adhesion strength can be obtained.

The third embodiment is substantially the same as the above first or second embodiment, except for the above-described respects.

Fourth Embodiment

Figure 19:
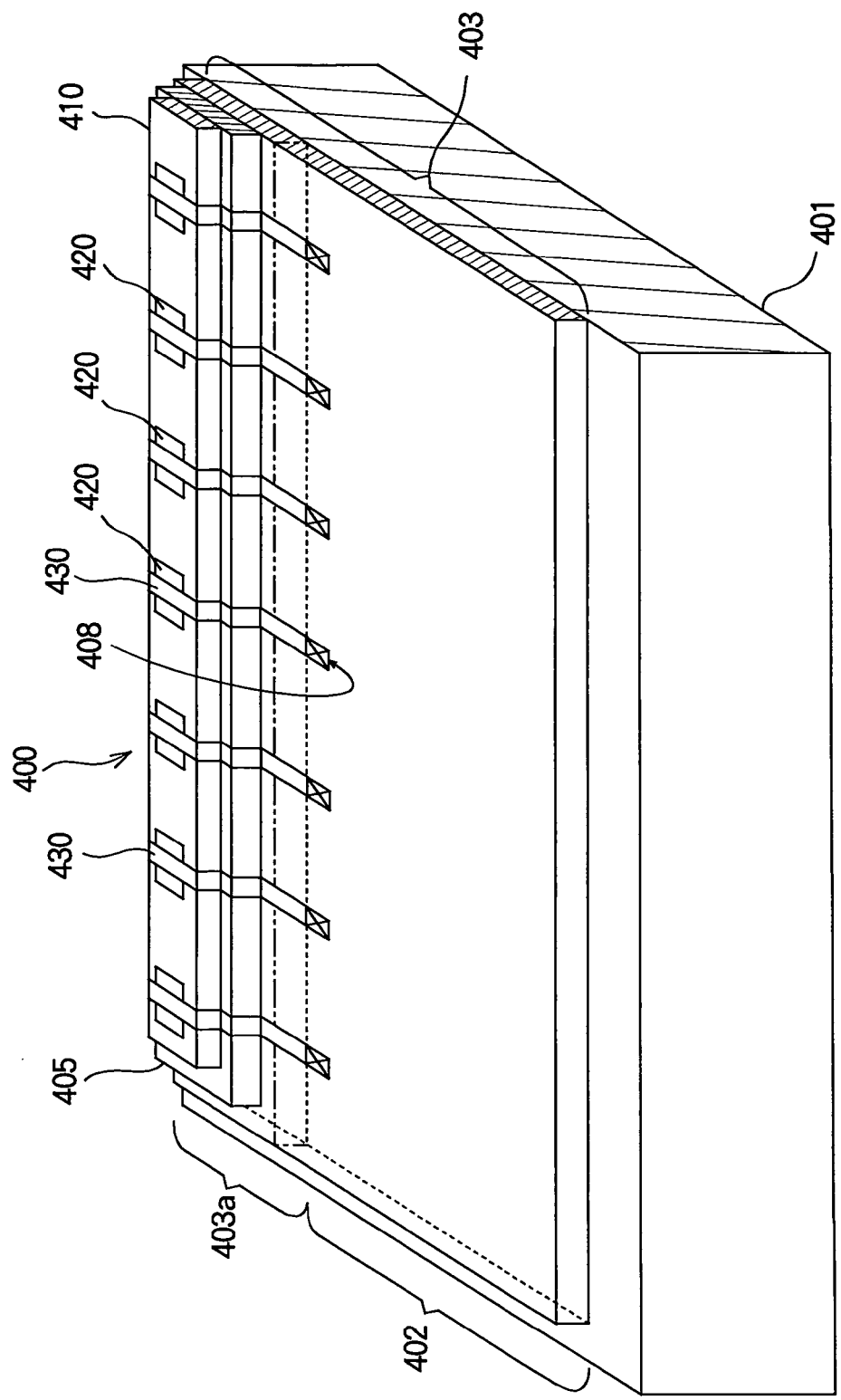
FIG. 19 is a perspective view schematically showing a part of an integrated LED/driving-IC chip in accordance with a fourth embodiment of the present invention.
Figure 20:
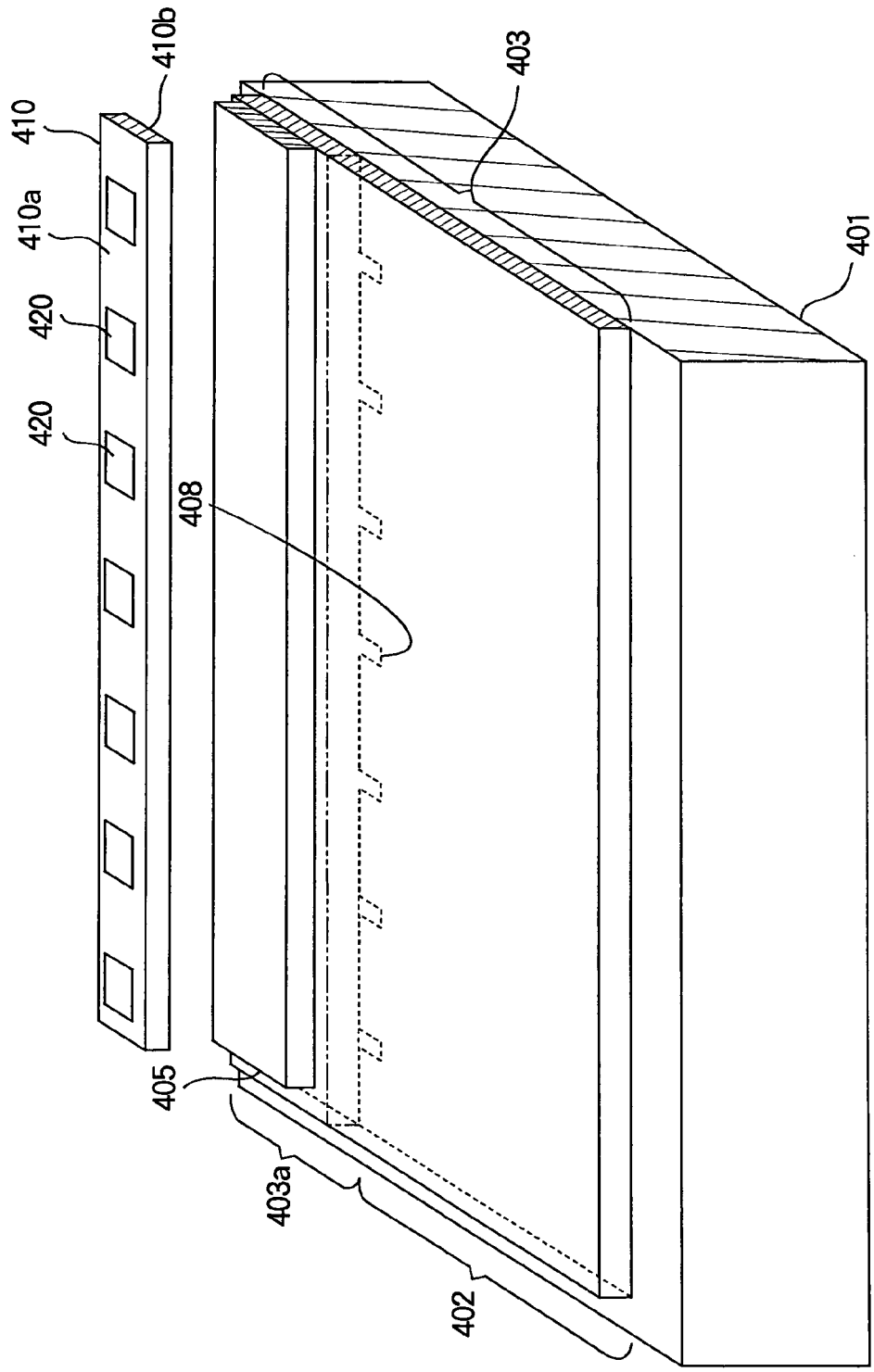
FIG. 20 is a perspective view schematically showing the integrated LED/driving-IC chip of the fourth embodiment before an LED epitaxial film is bonded.
Figure 21:
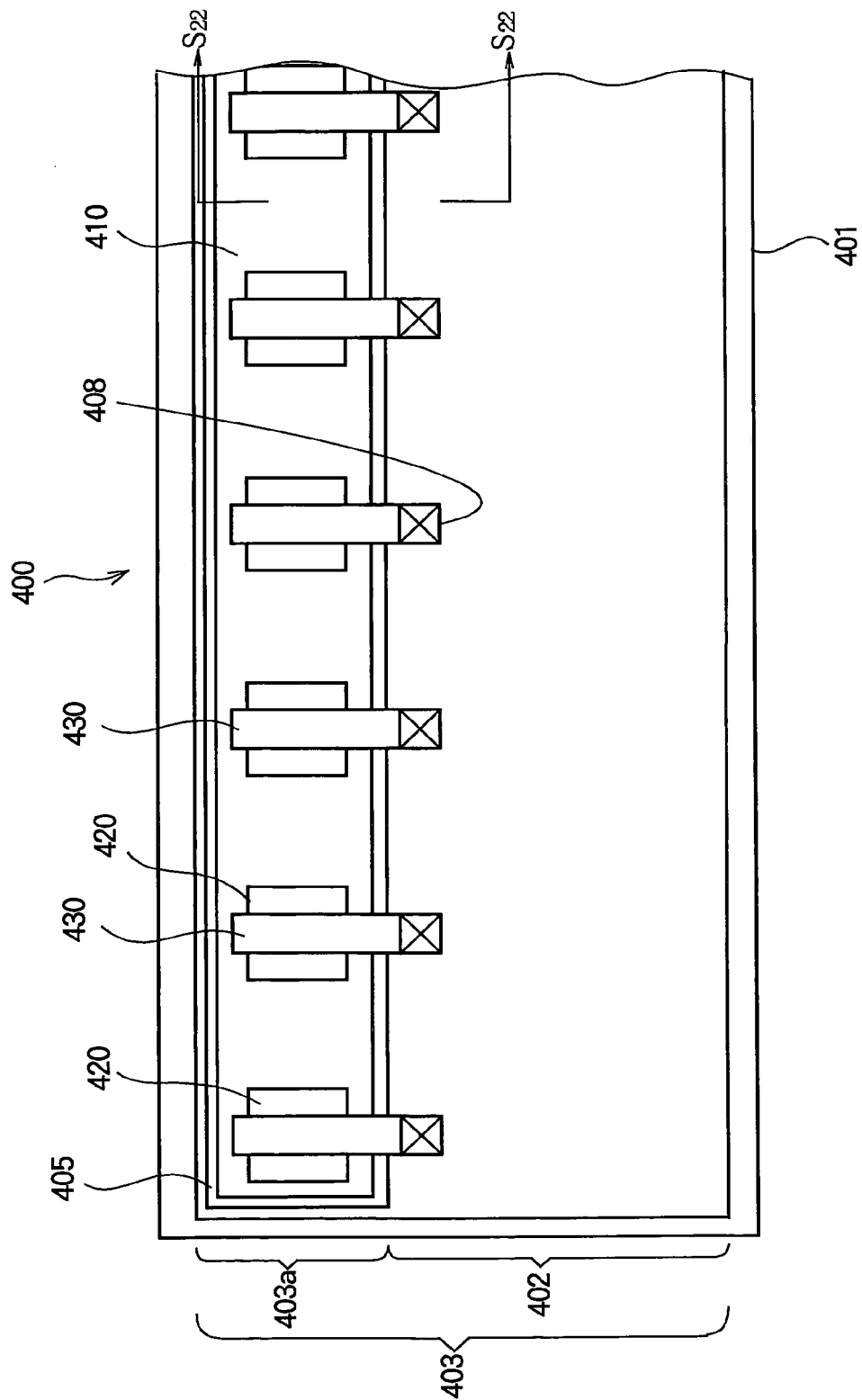
FIG. 21 is a plan view schematically showing a part of the integrated LED/driving-IC chip of the fourth embodiment.
Figure 22:
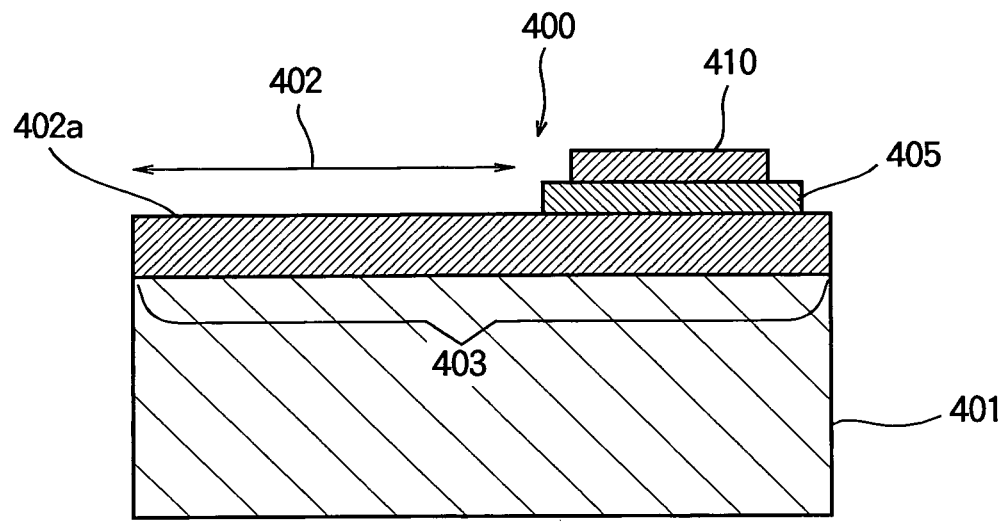
FIG. 22 is a schematic cross sectional view showing a cross section through line $S_{22}$-$S_{22}$ in FIG. 21.

FIG. 19 is a perspective view schematically showing a part of an integrated LED/driving-IC chip 400 in accordance with a fourth embodiment of the present invention, and FIG. 20 is a perspective view schematically showing the integrated LED/driving-IC chip 400 before an LED epitaxial film 410 is bonded. FIG. 21 is a plan view schematically showing a part of the integrated LED/driving-IC chip 400, and FIG. 22 is a cross sectional view showing a cross section through line $S_{22}$-$S_{22}$ in FIG. 21.

As shown in FIGS. 19 to 21, an integrated LED/driving-IC chip 400 of the fourth embodiment includes an Si substrate 401 having an integrated circuit 402, a planarized region 403 formed in (or on) a surface of the Si substrate 401, and a metal layer 405 as a planarized film formed on the planarized region 403. The planarized region 403 is obtained by forming a dielectric layer (not shown in the figures) on the surface of the Si substrate 401 and subjecting the surface of the Si substrate 401 having the dielectric layer to a planarizing process such as CMP. In the fourth embodiment, the planarized region 403 is formed on the integrated circuit 402 of the Si substrate 401 and on a region 403a adjacent to the integrated circuit 402. The metal layer 405 is formed on the region 403a adjacent to a region where the integrated circuit is formed, and an LED epitaxial film 410 is bonded on the surface of the metal layer 405.

As shown in FIGS. 19 to 21, the integrated LED/driving-IC chip 400 also a sheet-like LED epitaxial film 410 including LEDs 420 and bonded on the metal layer 405. The LED epitaxial film 410 has a common interconnecting layer (not shown in the figures) on a second surface 410b of the epitaxial film opposed to a first surface 410a, in which the LEDs 420 is formed. The LED epitaxial film 410 is bonded on the metal layer 405 so that the second surface 410b is located on the side of the planarized region 403 of the Si substrate 301. In this connection, similarly to the first embodiment, a plurality of metal layers may be formed so that the LEDs 420 of the first surface 410a are placed on the metal layers respectively. Similarly to the second embodiment, further, a plurality of LED epitaxial films each having a single LED may be arranged in a row on the metal layer. Furthermore, it is also possible not to provide the metal layer 405 and to bond the LED epitaxial film 410 directly on the surface (e.g., electrode area) of the region 403a of the Si substrate 401.

As shown in FIGS. 19 to 21, the integrated LED/driving-IC chip 400 also includes thin individual interconnecting layers 430 formed on a region extending from the upper surfaces of the LEDs 420 of the LED epitaxial film 410 to the upper surfaces of individual electrode terminals 408 of the integrated circuit 402. A suitable interdielectric layer (not shown in the figures) is provided under the thin individual interconnecting layers 430 (e.g., between the interconnecting layers and metal layer 405). The metal layer 405 is electrically connected to a common potential (e.g., ground potential) terminal provided on the substrate 401.

As has been explained above, in the integrated LED/driving-IC chip 400 of the fourth embodiment, the LED epitaxial film 410 can be bonded on the Si substrate 401 at a position higher than an irregular surface 402a of the integrated circuit 402 of the Si substrate 401. For this reason, such a problem that a part (e.g., a bonding collet) of a device used in the process of bonding the LED epitaxial film 410 onto the metal layer 405 abuts against the surface 402a of an integrated circuit 502 can be avoided.

The fourth embodiment is substantially the same as the above first to third embodiments, except for the above-described respects.

Fifth Embodiment

Figure 23:
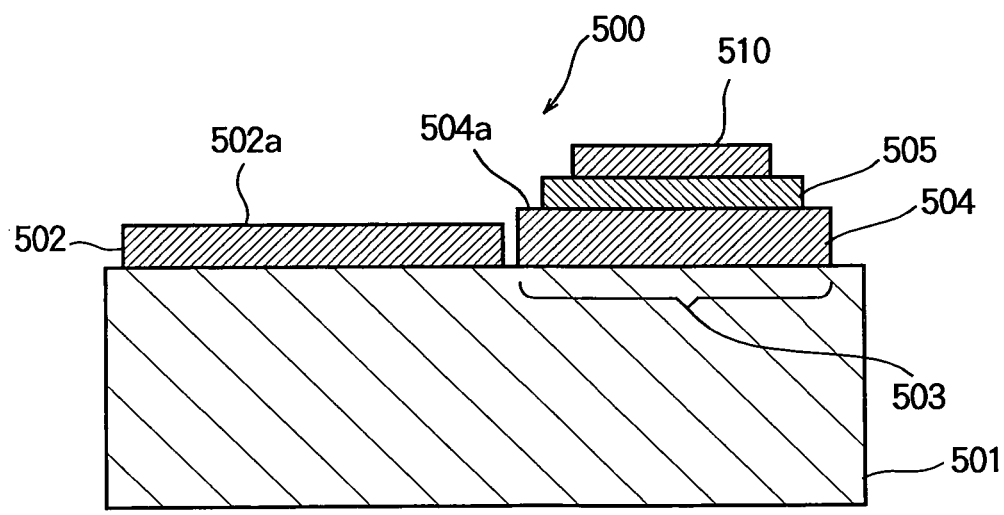
FIG. 23 is a schematic cross sectional view showing an integrated LED/driving-IC chip in accordance with a fifth embodiment of the present invention.

FIG. 23 is a cross sectional view schematically showing an integrated LED/driving-IC chip 500 in accordance with a fifth embodiment of the present invention.

The integrated LED/driving-IC chip 500 of the fifth embodiment includes an Si substrate 501 having the integrated circuit 502, and a raised layer 504 which is formed on a region 503 adjacent to a region where the integrated circuit 502 is placed. The raised layer 504 has a surface 504a at a position higher than a surface of the integrated circuit 502. The integrated LED/driving-IC chip 500 also includes a metal layer 505 formed on the raised layer 504, and an LED epitaxial film 510 bonded on the surface of the metal layer 505. The material and structure of the raised layer 504 can be freely selected. The raised layer 504 includes an interconnecting layer electrically connected to the metal layer 505 and an insulating layer formed in a region peripheral thereto.

As has been explained above, in the integrated LED/driving-IC chip 500 of the fifth embodiment, the LED epitaxial film 510 can be bonded at a position higher than the irregular surface 502a of the integrated circuit 502 of the Si substrate 501. For this reason, a problem that a part (e.g., bonding collet) of a device used in the process of bonding the LED epitaxial film 510 onto the metal layer 505 on the raised layer 504 can be easily avoided.

The fifth embodiment is substantially the same as the above first to fourth embodiments, except for the above-described respects.

LED Print Head

Figure 24:
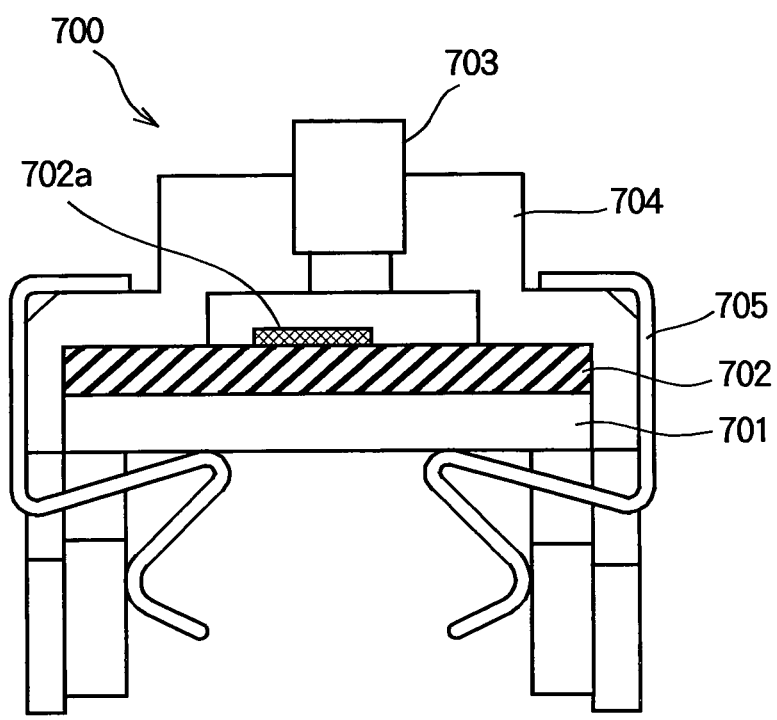
FIG. 24 is a schematic cross sectional view showing an LED print head equipped with a combined semiconductor apparatus of the present invention.

FIG. 24 is a schematic cross sectional view of an LED print head 700 having the semiconductor apparatus of the present invention built therein. As shown in FIG. 24, the LED print head 700 includes a base 701 on which an LED unit 702 is mounted. The LED unit 702 includes a plurality of integrated LED/driving-IC chips 702a of the type described in any of the preceding embodiments, mounted so that their light-emitting parts are positioned beneath a rod lens array 703. The rod lens array 703 is supported by a holder 704. The base 701, LED unit 702, and holder 704 are held together by clamps 705. Light emitted by the light-emitting elements in the LED unit 702 is focused by rod lenses in the rod lens array 703 onto, for example, a photosensitive drum (not shown) in an electrophotographic printer or copier.

Use of integrated LED/driving-IC chips 702a instead of the conventional paired LED array chips and driver IC chips enables the LED unit 702 to be reduced in size and reduces its assembly cost, as there are fewer chips to be mounted.

LED Printer

Figure 25:
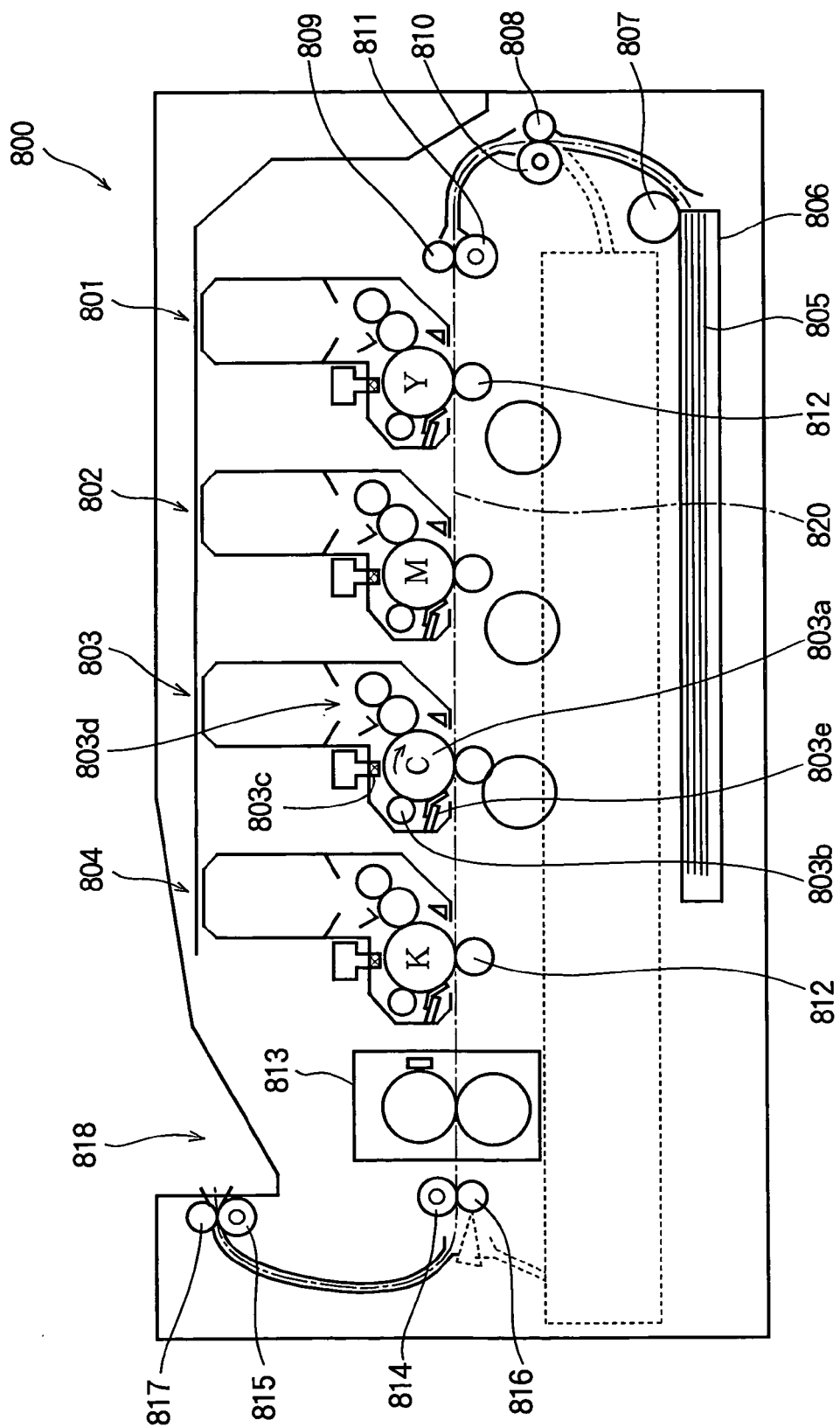
FIG. 25 is a schematic cutaway side view of an LED printer employing the invented semiconductor apparatus.
Figure 26:
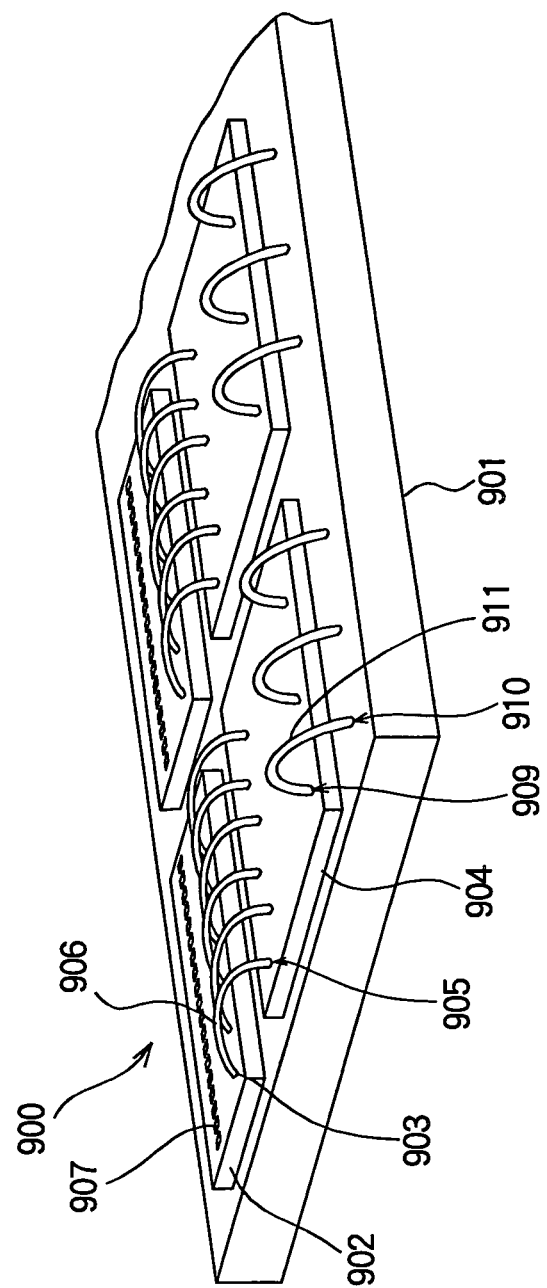
FIG. 26 is a perspective view schematically showing a part of a conventional LED print unit.
Figure 27:
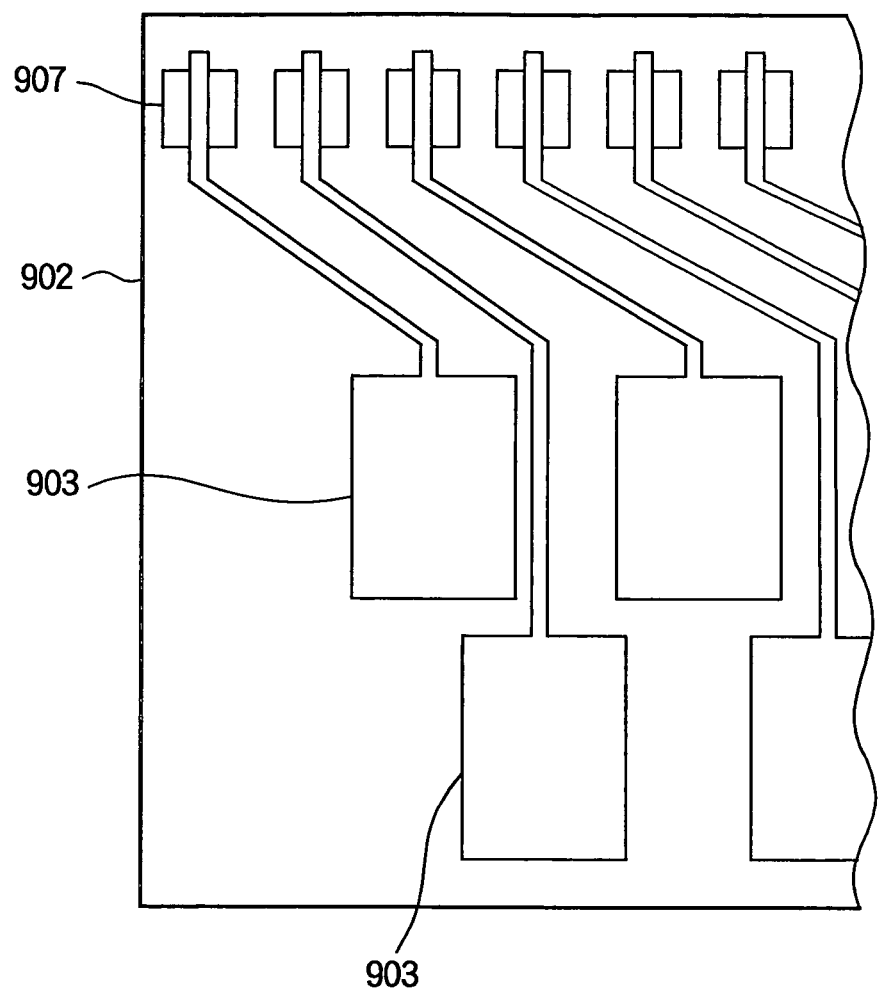
FIG. 27 is a plan view showing a part of an LED array chip provided in the LED print unit of FIG. 26.

FIG. 25 shows an example of a full-color LED printer 800 in which the present invention may be employed. The printer 800 has a yellow (Y) process unit 801, a magenta (M) process unit 802, a cyan (C) process unit 803, and a black (K) process unit 804, which are mounted following one another in tandem fashion. The cyan process unit 803, for example, includes a photosensitive drum 803a that turns in the direction indicated by the arrow, a charging unit 803b that supplies current to the photosensitive drum 803a to charge the surface thereof, an LED print head 803c that selectively illuminates the charged surface of the photosensitive drum 803a to form an electrostatic latent image, a developing unit 803d that supplies cyan toner particles to the surface of the photosensitive drum 803a to develop the electrostatic latent image, and a cleaning unit 803e that removes remaining toner from the photosensitive drum 803a after the developed image has been transferred to paper. The LED print head 803c has, for example, the structure shown in FIG. 24, including integrated LED/driving-IC chips 702a of the type described in any of the nine embodiments above. The other process units 801, 802, 804 are similar in structure to the cyan process unit 803, but use different toner colors.

The paper 805 (or other media) is held as a stack of sheets in a cassette 806. A hopping roller 807 feeds the paper 805 one sheet at a time toward a paired transport roller 810 and pinch roller 808. After passing between these rollers, the paper 805 travels to a registration roller 811 and pinch roller 809, which feed the paper toward the yellow process unit 801.

The paper 810 passes through the process units 801, 802, 803, 804 in turn, traveling in each process unit between the photosensitive drum and a transfer roller 812 made of, for example, semi-conductive rubber. The transfer roller 812 is charged so as to create a potential difference between it and the photosensitive drum. The potential difference attracts the toner image from the photosensitive drum onto the paper 805. A full-color image is built up on the paper 805 in four stages, the yellow process unit 801 printing a yellow image, the magenta process unit 802 a magenta image, the cyan process unit 803 a cyan image, and the black process unit 804 a black image.

From the black process unit 804, the paper 805 travels through a fuser 813, in which a heat roller and back-up roller apply heat and pressure to fuse the transferred toner image onto the paper. A first delivery roller 814 and pinch roller 816 then feed the paper 805 upward to a second delivery roller 815 and pinch roller 817, which deliver the printed paper onto a stacker 818 at the top of the printer.

The photosensitive drums and various of the rollers are driven by motors and gears not shown in the drawing. The motors are controlled by a control unit (not shown) that, for example, drives the transport roller 810 and halts the registration roller 811 until the front edge of a sheet of paper 805 rests flush against registration roller 811, then drives the registration roller 811, thereby assuring that the paper 805 is correctly aligned during its travel through the process units 801, 802, 803, 804. The transport roller 810, registration roller 811, delivery rollers 814, 815, and pinch rollers 808, 809, 816, 817 also have the function of changing the direction of travel of the paper 805.

The LED heads account for a significant part of the manufacturing cost of this type of LED printer 800. By using highly reliable and space-efficient integrated LED/driving-IC chips and enabling these chips and the LED units in the LED heads to be manufactured by a simplified fabrication process with reduced material costs, the present invention enables a high-quality printer to be produced at a comparatively low cost.

Similar advantages are obtainable if the invention is applied to a full-color copier. The invention can also be advantageously used in a monochrome printer or copier or a multiple-color printer or copier, but its effect is particularly great in a full-color image-forming apparatus (printer or copier), because of the large number of exposure devices (print heads) required in such apparatus.

Modifications of Embodiments

Although explanation has been made in the foregoing embodiments in connection with the case where the planarized film on the Si substrate includes the metal layer, the metal layer may be replaced by an electrically conductive thin layer such as polysilicon, electrically conductive oxide (ITO, ZnO), or the like.

Explanation has been made in the foregoing embodiments in connection with the case where the Si substrate is used as the semiconductor substrate. However, the semiconductor substrate may be made of other materials such as amorphous silicon, single crystal silicon, polysilicon, compound semiconductor or organic semiconductor.

Although explanation has been made in the foregoing embodiments in connection with the case where the semiconductor device provided to the semiconductor thin film is the LED, the semiconductor device may be another light-emitting element such as a laser, a light-sensing element, a Hall element, or a piezoelectric element.

Explanation has been made in the foregoing embodiments in connection with the case where the LED epitaxial film is made of epitaxial layers. However, a semiconductor thin film other than the epitaxial layer may be employed as the LED epitaxial film.

Explanation has been made in the foregoing embodiments in connection with the case where the LED epitaxial film is bonded onto the planarized region on the semiconductor substrate or on the planarized film. When the semiconductor substrate has a less roughened surface, however, the LED epitaxial film may be bonded on a region not subjected to planarizing process such as CMP.

What is claimed is:

1. A combined semiconductor apparatus comprising:
a substrate having an integrated circuit;
a planarized region being a planarized layer disposed on a surface of the substrate, wherein an upper surface of the planarized layer has been subjected to a planarizing process;
a planarized metal layer disposed on the upper surface of the planarized region, wherein an upper surface of the planarized metal layer has been subjected to a planarizing process to be a planar surface;
a plurality of semiconductor thin films bonded to the upper surface of the planarized metal layer so as to be arranged at regular intervals, each of the semiconductor thin films having a thickness of 10 μm or less, each of the semiconductor thin films being made of compound semiconductor selected from the group consisting of $Al_xGa_{1-x}As$ ($0 \leq x \leq 1$), $(Al_xGa_{1-x})_yIn_{1-y}P$ ($0 \leq x \leq 1$ and $0 \leq y \leq 1$), GaN, AlGaN and InGaN, each of the semiconductor thin films having a single light emitting element, a whole lower surface of each of the semiconductor thin films being in contact with the upper surface of the planarized metal layer; and
a plurality of thin metal interconnecting layers extending from upper surfaces of the semiconductor thin films to an upper surface of the integrated circuit respectively, such that an upper layer of each of the semiconductor thin films has an exposed part that is uncovered by the thin metal interconnecting layer.

* * * * *